(12) United States Patent
Kumakura et al.

(10) Patent No.: US 10,672,605 B2
(45) Date of Patent: Jun. 2, 2020

(54) FILM FORMING METHOD

(71) Applicant: Tokyo Electron Limited, Tokyo (JP)

(72) Inventors: Sho Kumakura, Miyagi (JP);
Masahiro Tabata, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 31 days.

(21) Appl. No.: 15/952,359

(22) Filed: Apr. 13, 2018

(65) Prior Publication Data

US 2018/0301332 A1 Oct. 18, 2018

(30) Foreign Application Priority Data

Apr. 14, 2017 (JP) ................................. 2017-080800

(51) Int. Cl.
| | |
|---|---|
| *H01L 21/02* | (2006.01) |
| *H01L 21/3065* | (2006.01) |
| *H01L 21/311* | (2006.01) |
| *H01L 29/66* | (2006.01) |

(52) U.S. Cl.
CPC .. *H01L 21/02274* (2013.01); *H01L 21/02164* (2013.01); *H01L 21/02211* (2013.01); *H01L 21/02219* (2013.01); *H01L 21/3065* (2013.01); *H01L 21/31116* (2013.01); *H01L 21/31144* (2013.01); *H01L 29/66742* (2013.01); *H01L 29/66795* (2013.01)

(58) Field of Classification Search
None
See application file for complete search history.

(56) References Cited

U.S. PATENT DOCUMENTS

| | | | |
|---|---|---|---|
| 7,344,996 B1 | 3/2008 | Lang et al. | |
| 2006/0157749 A1* | 7/2006 | Okuno | ............. H01L 29/41791 257/288 |
| 2016/0163556 A1 | 6/2016 | Briggs et al. | |
| 2016/0293398 A1* | 10/2016 | Danek | ................. H01L 21/0228 |
| 2017/0062469 A1* | 3/2017 | Tsiang | ............... H01L 21/3115 |

\* cited by examiner

*Primary Examiner* — Julio J Maldonado
*Assistant Examiner* — Stanetta D Isaac
(74) *Attorney, Agent, or Firm* — Pearne & Gordon LLP

(57) ABSTRACT

A technique regarding film formation capable of forming a three-dimensional pattern successfully is provided. A film forming method for a processing target object is provided. The processing target object has a supporting base body and a processing target layer. The processing target layer is provided on a main surface of the supporting base body and includes protrusion regions. Each protrusion region is extended upwards from the main surface, and an end surface of each protrusion region is exposed when viewed from above the main surface. The film forming method includes a first process of forming a film on the end surface of each protrusion region; and a second process of selectively exposing one or more end surfaces by anisotropically etching the film formed through the first process.

19 Claims, 13 Drawing Sheets

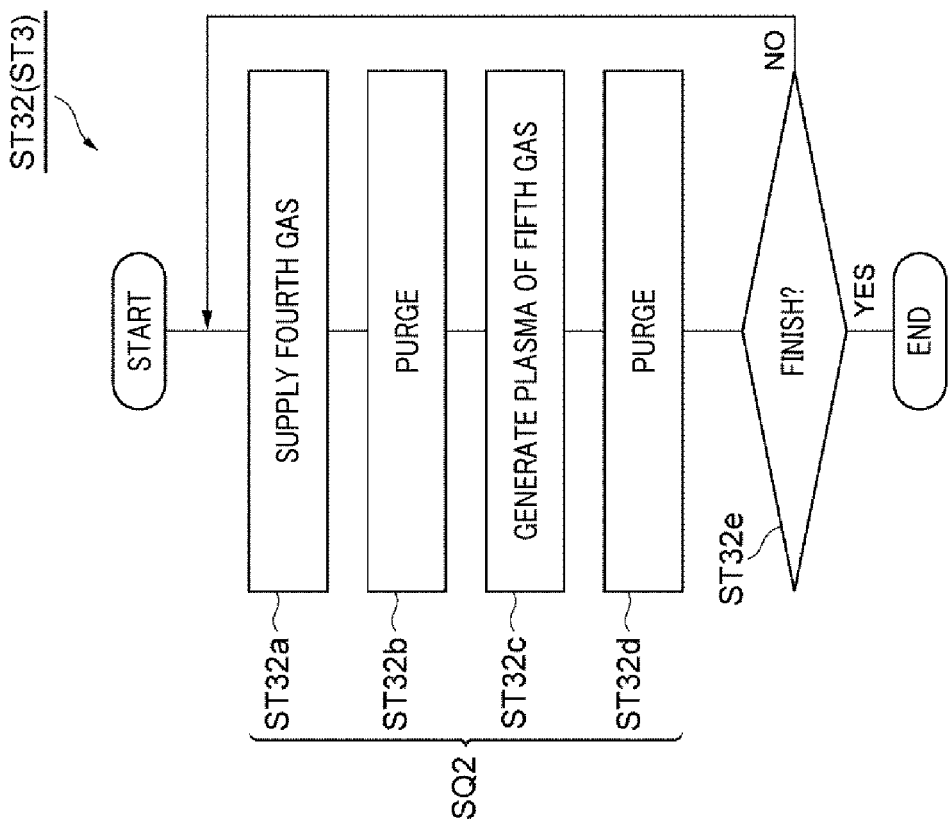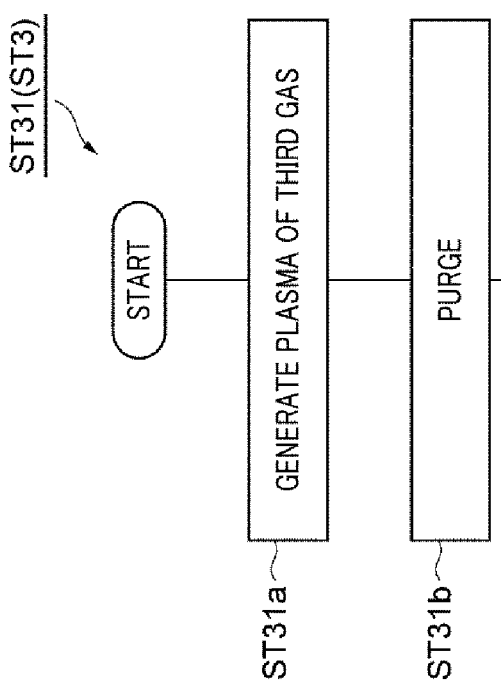

FILM FORMING METHOD

CROSS-REFERENCE TO RELATED APPLICATION

This application claims the benefit of Japanese Patent Application No. 2017-080800 filed on Apr. 14, 2017, the entire disclosures of which are incorporated herein by reference.

TECHNICAL FIELD

The embodiments described herein pertain generally to a film forming method for a processing target object.

BACKGROUND

In the field of semiconductor manufacture, it is required to form a highly fine wiring pattern to meet a recent trend for miniaturization of semiconductor devices. For the purpose, it is required to control a thickness of a thin film. Patent Document 1 discloses a technique regarding formation of a thin film using atomic layer deposition (ALD) or chemical vapor deposition (CVD).

Patent Document 1: US Patent Application Publication No. 2016/0163556

Patent Document 2: U.S. Pat. No. 7,344,996

SUMMARY

In performing a film formation in order to form a complicated three-dimensional pattern having multiple end surfaces (etching target surfaces) of different heights, a deposit may be generated at, among grooves of the pattern, a region having a relatively high aspect ratio, and the grooves of the pattern may have non-uniform widths according to denseness and sparseness of the pattern. Thus, the three-dimensional pattern may not be formed successfully due to these various problems. In this regard, there has been a demand for a technique regarding the film formation capable of forming the three-dimensional pattern successfully.

In an exemplary embodiment, there is provided a film forming method for a processing target object. The processing target object has a supporting base body and a processing target layer. The processing target layer is provided on a main surface of the supporting base body and includes protrusion regions. Each of the protrusion regions is extended upwards from the main surface, and an end surface of each of the protrusion regions is exposed when viewed from above the main surface. The film forming method includes a first process of forming a film on the end surface of each of the protrusion regions; and a second process of selectively exposing one or more of the end surfaces by anisotropically etching the film formed through the first process. The film comprises a first film and a second film. The first process comprises a third process of forming the first film conformally and a fourth process of forming the second film on the first film. The second film is formed in the fourth process such that a thickness of the second film is increased as being distanced farther from the main surface.

In this method, as for the protrusion regions each having the end surface, the film is formed on each of the end surfaces through the first process, and only the film on one or more of the end surfaces is selectively removed through the second process. Particularly, in the first process, the first film is conformally formed, and the second film is formed on the first film such that a thickness of the second film is increased as being distanced away from the main surface. Accordingly, since the thickness of the film formed through the first process differs depending on a distance from the main surface of the supporting base body, an end surface, on which the film is formed in a relatively thin thickness, is selectively exposed through the second process.

The first film is conformally formed in the third process by repeating a first sequence comprising a fifth process of supplying a first gas into a space in which the processing target object is placed; a sixth process of purging, after the fifth process, the space in which the processing target object is placed; a seventh process of generating, after the sixth process, plasma of a second gas in the space in which the processing target object is placed; and an eighth process of purging, after the seventh process, the space in which the processing target object is placed. Plasma of the first gas is not generated in the fifth process. The film having a uniform thickness is conformally formed on the respective end surfaces of the protrusion regions of the processing target layer.

The first gas contains an organic-containing aminosilane-based gas, and the second gas contains oxygen atoms. The first gas may contain monoaminosilane. The aminosilane-based gas contained in the first gas may include aminosilane having one to three silicon atoms. The aminosilane-based gas contained in the first gas may include aminosilane having one to three amino groups. Through the fifth process, the reaction precursor of the silicon can be formed by using the first gas containing the monoaminosilane. The aminosilane having the one to three silicon atoms can be used as the aminosilane-based gas included in the first gas in the exemplary embodiment. Further, the aminosilane having the one to three amino groups can be used as the aminosilane-based gas included in the first gas in the exemplary embodiment.

In the fourth process, plasma of a third gas is generated in a space in which the processing target object is placed. The third gas contains silicon atoms and contains chlorine atoms or hydrogen atoms. The third gas includes a $SiCl_4$ gas or a $SiH_4$ gas. With the plasma of the third gas containing the silicon atoms and containing the chlorine atoms or the hydrogen atoms, for example, the third gas containing the $SiCl_4$ gas or the $SiH_4$ gas, the second film of the silicon oxide film can be additionally formed on the first film of the silicon oxide film, which is conformally formed in the third process prior to the fourth process, in the exemplary embodiment.

The second film is formed in the fourth process by repeating a second sequence comprising a ninth process of supplying a fourth gas into a space in which the processing target object is placed; a tenth process of purging, after the ninth process, the space in which the processing target object is placed; an eleventh process of generating, after the tenth process, plasma of a fifth gas in the space in which the processing target object is placed; and a twelfth process of purging, after the eleventh process, the space in which the processing target object is placed. Plasma of the fourth gas is not generated in the ninth process. The fourth gas contains silicon atoms and chlorine atoms, and the fifth gas contains oxygen atoms. The fourth gas may include a mixed gas containing a $SiCl_4$ gas and an Ar gas. The second sequence including the ninth process using the fourth gas containing the silicon atoms and the chlorine atoms, for example, the fourth gas containing the mixed gas of the $SiCl_4$ and the Ar gas and including the eleventh process using the plasma of the fifth gas containing the oxygen atoms is repeated. As a result, the second film of the silicon oxide film can be additionally formed on the first film of the silicon oxide film, which is conformally formed in the third process prior to the fourth process, in the exemplary embodiment.

In the second process, plasma of a sixth gas is generated in a space in which the processing target object is placed and a bias power is applied to the plasma of the sixth gas. The sixth gas contains a fluorocarbon-based gas. The end surface, on which the film having the relatively thin thickness is provided, is selectively exposed through the anisotropic etching with the plasma of the fluorocarbon-based gas in the exemplary embodiment.

In the exemplary embodiment, the film forming method further includes a thirteenth process of etching the processing target layer after the second process is performed. Through the thirteenth process, it is possible to perform desirable etching on the end surface exposed in the second process according to the exemplary embodiment.

The processing target layer includes silicon nitride, and the film contains silicon oxide.

As stated above, it is possible to provide the technique regarding the film formation capable of forming the three-dimensional pattern successfully.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 10A and FIG. 10B are flowcharts for describing a process of a part of the method shown in FIG. 1 in further detail;

DETAILED DESCRIPTION

Figure 1:
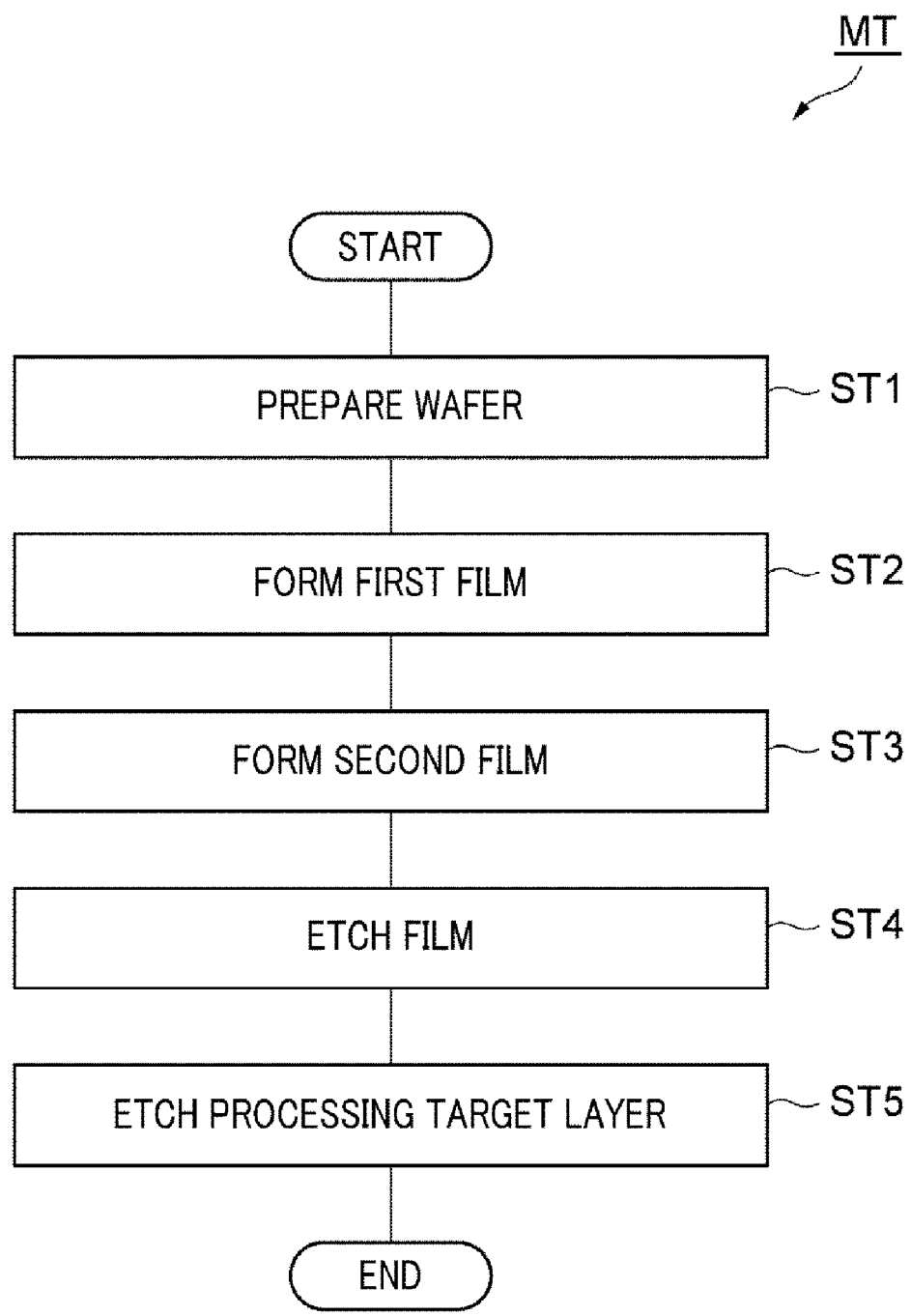
FIG. 1 is a flowchart for describing a method according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments of the present disclosure will be explained in detail with reference to the accompanying drawings. In the various drawings, same or corresponding parts will be assigned same reference numerals. Now, a film forming method (method MT) which can be performed by using a plasma processing apparatus 10 will be explained with reference to FIG. 1. FIG. 1 is a flowchart for describing the method according to an exemplary embodiment. The method MT according to the exemplary embodiment shown in FIG. 1 is an example of the film forming method upon a processing target object (hereinafter, sometimes referred to as "wafer").

Figure 2:
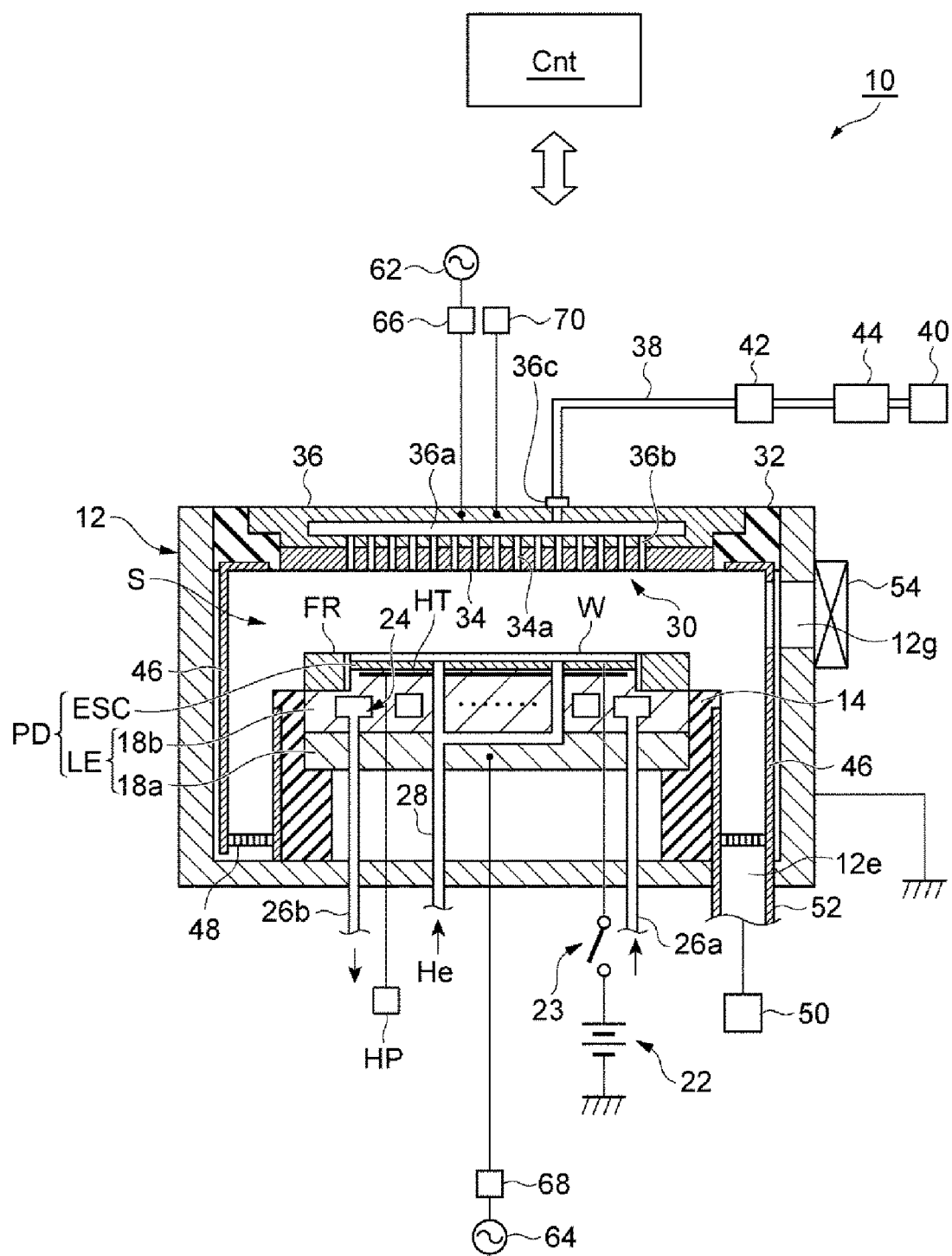
FIG. 2 is a diagram illustrating an example of a plasma processing apparatus.

In the method MT according to the exemplary embodiment, a series of processes can be performed by using a single plasma processing apparatus. FIG. 2 is a diagram illustrating an example of the plasma processing apparatus. FIG. 2 schematically illustrates a cross sectional configuration of the plasma processing apparatus 10 which can be used in various exemplary embodiments of a method of processing a processing target object. As depicted in FIG. 2, the plasma processing apparatus 10 is configured as a plasma etching apparatus having parallel plate type electrodes and includes a processing vessel 12. The processing vessel 12 has a substantially cylindrical shape. The processing vessel 12 is made of, by way of example, but not limitation, aluminum, and an inner wall surface of the processing vessel 12 is anodically oxidized. The processing vessel 12 is frame-grounded.

A substantially cylindrical supporting member 14 is provided on a bottom portion of the processing vessel 12. The supporting member 14 is made of, by way of example, but not limitation, an insulating material. The insulating material forming the supporting member 14 may contain oxygen, such as quartz. Within the processing vessel 12, the supporting member 14 is vertically extended from the bottom portion of the processing vessel 12. A mounting table PD is provided within the processing vessel 12. The mounting table PD is supported by the supporting member 14.

The mounting table PD is configured to hold the wafer W on a top surface thereof. The mounting table PD includes a lower electrode LE and an electrostatic chuck ESC. The lower electrode LE is provided with a first plate 18a and a second plate 18b. The first plate 18a and the second plate 18b are made of a metal such as, but not limited to, aluminum and have a substantially disk shape. The second plate 18b is provided on the first plate 18a and electrically connected with the first plate 18a.

The electrostatic chuck ESC is provided on the second plate 18b. The electrostatic chuck ESC includes a pair of insulating layers or insulating sheets; and an electrode embedded therebetween. The electrode of the electrostatic chuck ESC is electrically connected to a DC power supply 22 via a switch 23. The electrostatic chuck ESC is configured to attract the wafer W by an electrostatic force such as a Coulomb force generated by a DC voltage applied from the DC power supply 22. Accordingly, the electrostatic chuck ESC is capable of holding the wafer W.

A focus ring FR is provided on a peripheral portion of the second plate 18b to surround an edge of the wafer W and the electrostatic chuck ESC. The focus ring FR is configured to improve etching uniformity. The focus ring FR is made of a material which is appropriately selected depending on a material of an etching target film. For example, the focus ring FR may be made of quartz.

A coolant path 24 is provided within the second plate 18b. The coolant path 24 constitutes a temperature control mechanism. A coolant is supplied into the coolant path 24 from a chiller unit (not shown) provided outside the processing vessel 12 via a pipeline 26a. The coolant supplied into the coolant path 24 is then returned back into the chiller unit via a pipeline 26b. In this way, the coolant is supplied to be circulated through the coolant path 24. A temperature of the wafer W held by the electrostatic chuck ESC is controlled by adjusting a temperature of the coolant.

The plasma processing apparatus 10 is provided with a gas supply line 28. Through the gas supply line 28, a heat transfer gas, e.g., a He gas, is supplied from a heat transfer gas supply device into a gap between a top surface of the electrostatic chuck ESC and a rear surface of the wafer W.

The plasma processing apparatus 10 is also equipped with a heater HT as a heating device. The heater HT is embedded in, for example, the second plate 18b, and is connected to a heater power supply HP. As a power is supplied to the heater HT from the heater power supply HP, the temperature of the mounting table PD is adjusted so that the temperature of the wafer W placed on the mounting table PD is adjusted. Alternatively, the heater HT may be embedded in the electrostatic chuck ESC.

The plasma processing apparatus 10 includes an upper electrode 30. The upper electrode 30 is provided above the mounting table PD, facing the mounting table PD. The lower electrode LE and the upper electrode 30 are arranged to be substantially parallel to each other. Provided between the upper electrode 30 and the lower electrode LE is a processing space S in which a plasma processing is performed on the wafer W.

The upper electrode 30 is supported at an upper portion of the processing vessel 12 with an insulating shield member 32 therebetween. The insulating shield member 32 is made of an insulating material, such as quartz, containing oxygen. The upper electrode 30 may include an electrode plate 34 and an electrode supporting body 36. The electrode plate 34 faces the processing space S, and is provided with a multiple number of gas discharge holes 34a. In the exemplary embodiment, the electrode plate 34 contains silicon. In another exemplary embodiment, the electrode plate 34 may contain silicon oxide.

The electrode supporting body 36 is configured to support the electrode plate 34 in a detachable manner, and is made of a conductive material such as, but not limited to, aluminum. The electrode supporting body 36 may have a water-cooling structure. A gas diffusion space 36a is formed within the electrode supporting body 36. A multiple number of gas through holes 36b are extended downwards from the gas diffusion space 36a to communicate with the gas discharge holes 34a, respectively. The electrode supporting body 36 is provided with a gas inlet opening 36c through which a gas is introduced into the gas diffusion space 36a, and a gas supply line 38 is connected to the gas inlet opening 36c.

The gas supply line 38 is connected to a gas source group 40 via a valve group 42 and a flow rate control unit group 44. The gas source group 40 includes a plurality of gas sources. Examples of the plurality of gas sources according to the exemplary embodiment are described below, but not limited thereto. These gas sources include a source of an organic-containing aminosilane-based gas, a source of a fluorocarbon-based gas ($C_xF_y$ gas (x and y denote integers ranging from 1 to 10)), a source of a gas having an oxygen atom (e.g., an oxygen gas, etc.), a source of a $NF_4$ gas, a source of a hydrogen-containing gas (e.g., a hydrogen gas, a $SiH_4$ gas, etc.) and a source of a rare gas (e.g., an Ar gas, etc.). The fluorocarbon-based gas may be, by way of example, a $CF_4$ gas, a $C_4F_6$ gas, a $C_4F_8$ gas, or the like. As the aminosilane-based gas, one having a molecular structure, which contains a relatively small number of amino groups, may be used. For example, monoaminosilane ($H_3$—Si—R (R denotes an amino group which contains organic and can be substituted)) may be used. Further, the aforementioned aminosilane-based gas (a gas contained in a first gas G1 to be described later) may contain aminosilane having one to three silicon atoms or aminosilane having one to three amino groups. The aminosilane having the one to three silicon atoms may be monosilane (monoaminosilane) having one to three amino groups, disilane having one to three amino groups, or trisilane having one to three amino groups. Further, the aforementioned aminosilane may have an amino group which can be substituted. Further, the aforementioned amino group may be substituted by one of a methyl group, an ethyl group, a propyl group or a butyl group. Further, the methyl group, the ethyl group, the propyl group or the butyl group may be substituted by halogen. Any of various rare gases such as an Ar gas and a He gas may be used as the rare gas.

The valve group 42 includes a plurality of valves, and the flow rate control unit group 44 includes a plurality of flow rate control units such as mass flow controllers. Each of the plurality of gas sources of the gas source group 40 is connected to the gas supply line 38 via a corresponding valve of the valve group 42 and a corresponding flow rate control unit of the flow rate control unit group 44. Accordingly, the plasma processing apparatus 10 is capable of supplying gases into the processing vessel 12 from one or more gas sources selected from the plurality of gas sources of the gas source group 40 at individually controlled flow rates.

In the plasma processing apparatus 10, a deposition shield 46 is detachably provided along an inner wall of the processing vessel 12. The deposition shield 46 is also provided on an outer side surface of the supporting member 14. The deposition shield 46 is configured to suppress an etching byproduct (deposit) from adhering to the processing vessel 12, and may be formed of an aluminum member coated with ceramics such as $Y_2O_3$. The deposition shield may be made of a material containing oxygen, such as quartz, besides $Y_2O_3$.

At the bottom portion of the processing vessel 12, a gas exhaust plate 48 is provided between the supporting member 14 and the sidewall of the processing vessel 12. The gas exhaust plate 48 may be made of, by way of example, an aluminum member coated with ceramic such as $Y_2O_3$. The processing vessel 12 is also provided with a gas exhaust opening 12e under the gas exhaust plate 48, and the gas exhaust opening 12e is connected with a gas exhaust device 50 via a gas exhaust line 52. The gas exhaust device 50 has a vacuum pump such as a turbo molecular pump and is capable of decompressing the processing space S of the processing vessel 12 to a required vacuum level. A carry-in/out opening 12g for the wafer W is provided at the sidewall of the processing vessel 12, and the carry-in/out opening 12g is opened/closed by a gate valve 54.

The plasma processing apparatus 10 further includes a first high frequency power supply 62 and a second high frequency power supply 64. The first high frequency power supply 62 is configured to generate a first high frequency power for plasma generation having a frequency ranging from 27 MHz to 100 MHz, e.g., 60 MHz. The first high frequency power supply 62 is connected to the upper electrode 30 via a matching device 66. The matching device 66 is a circuit configured to match an output impedance of the first high frequency power supply 62 and an input impedance at a load side (lower electrode LE side). Further, the first high frequency power supply 62 may be connected to the lower electrode LE via the matching device 66.

The second high frequency power supply 64 is configured to generate a second high frequency power for ion attraction into the wafer W. For example, the second high frequency power supply 64 generates a high frequency bias power having a frequency ranging from 400 kHz to 40.68 MHz, e.g., 13.56 MHz. The second high frequency power supply 64 is connected to the lower electrode LE via a matching device 68. The matching device 68 is a circuit configured to match an output impedance of the second high frequency power supply 64 and the input impedance at the load side (lower electrode LE side).

The plasma processing apparatus 10 further includes a power supply 70. The power supply 70 is connected to the upper electrode 30. The power supply 70 applies to the upper electrode 30 a voltage for attracting positive ions existing in the processing space S into the electrode plate 34. As an example, the power supply 70 is a DC power supply configured to generate a negative DC voltage. If this voltage is applied to the upper electrode 30 from the power supply 70, the positive ions existing in the processing space S collide with the electrode plate 34. As a result, secondary electrons and/or silicon is released from the electrode plate 34.

In the exemplary embodiment, the plasma processing apparatus 10 further includes a control unit Cnt. The control unit Cnt is implemented by a computer including a processor, a storage unit, an input device, a display device, and so forth, and is configured to control the individual components of the plasma processing apparatus 10. To be specific, the control unit Cnt is connected to the valve group 42, the flow rate control unit group 44, the gas exhaust device 50, the first high frequency power supply 62, the matching device 66, the second high frequency power supply 64, the matching device 68, the power supply 70, the heater power supply HP and the chiller unit.

The control unit Cnt is operated to output a control signal according to a program based on an input recipe. Selection of the gas supplied from the gas source group 40 and a flow rate of the selected gas, the gas exhaust by the gas exhaust device 50, the power supplies from the first high frequency power supply 62 and the second high frequency power supply 64, the voltage application from the power supply 70, the power supply of the heater power supply HP, and the control of the flow rate and the temperature of the coolant from the chiller unit can be achieved in response to control signals from the control unit Cnt. Further, individual processes of the method MT of processing the processing target object in the preset specification can be carried out as the individual components of the plasma processing apparatus 10 are operated under the control by the control unit Cnt.

Figure 3:
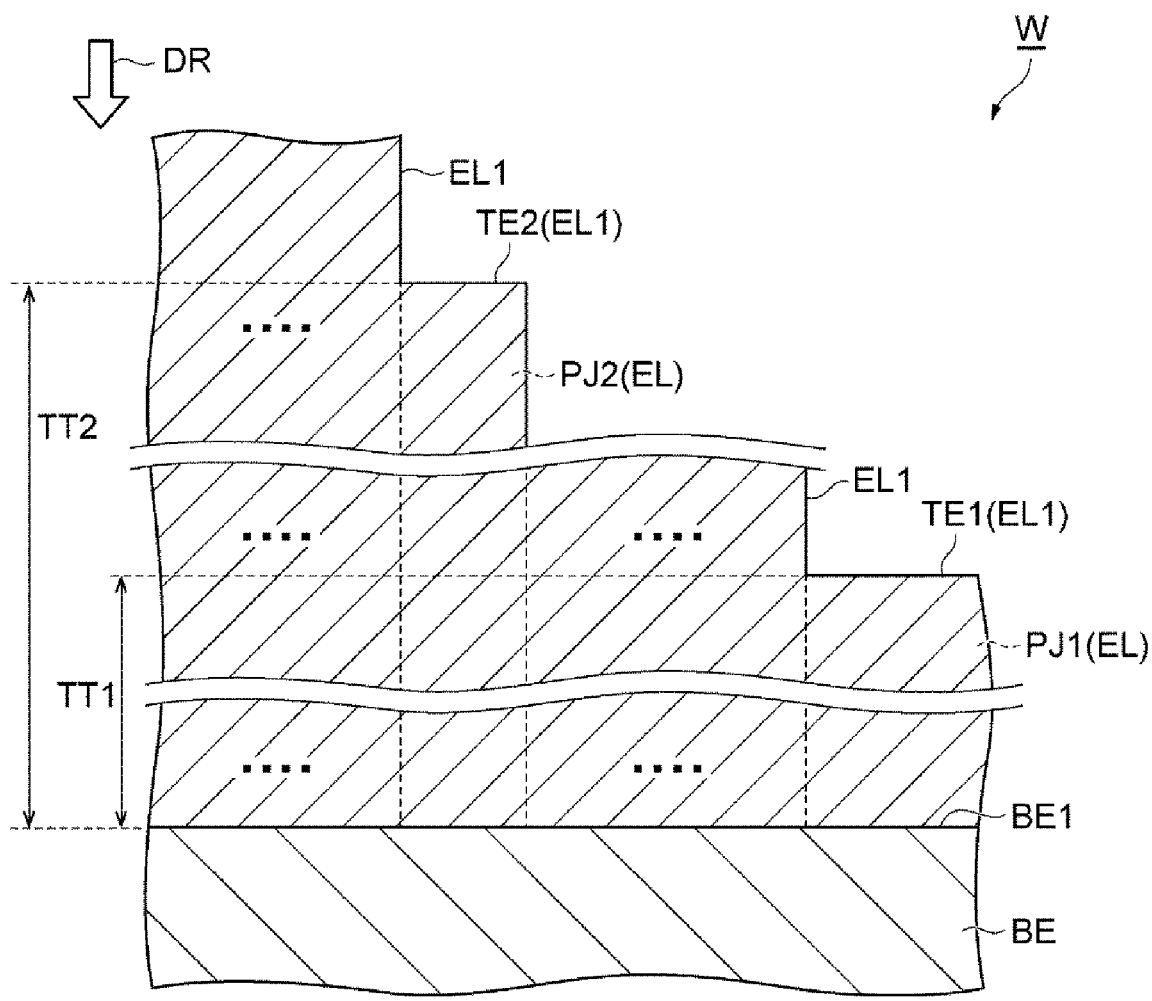
FIG. 3 is a cross sectional view schematically illustrating a state of major portions of a surface of a wafer before the method shown in FIG. 1 is performed.

Referring back to FIG. 1, the explanation of the method MT will be carried on. In the following description, reference is made to FIG. 2 to FIG. 13C as well as FIG. 1. Major structure of the wafer W prepared in a process ST1 of the method MT shown in FIG. 1 will be explained with reference to FIG. 3. The wafer W prepared in the process ST1 is shown in FIG. 3. The wafer W depicted in FIG. 3 has a supporting base body BE and a processing target layer EL. The processing target layer EL is provided on a main surface BE1 of the supporting base body BE. The main surface BE1 is extended to be perpendicular to a surface-perpendicular direction DR. The surface-perpendicular direction DR corresponds to a vertical direction in a state that the wafer W is placed on the electrostatic chuck ESC, as shown in FIG. 2.

The processing target layer EL has a plurality of protrusion regions (e.g., a protrusion region PJ1, a protrusion region PJ2, etc.). Each of the plurality of protrusion regions of the processing target layer EL is extended upwards from the main surface BE1. Each of the plurality of protrusion regions of the processing target layer EL has an end surface. The protrusion region PJ1 has an end surface TE1. The protrusion region PJ2 has an end surface TE2. The end surfaces of the individual protrusion regions of the processing target layer EL are exposed when viewed from above the main surface BE1. The end surface TE1 of the protrusion region PJ1 and the end surface TE2 of the protrusion region PJ2 are all exposed when viewed from above the main surface BEl A height of the protrusion region is a distance from the main surface BE1 to an end surface of the corresponding protrusion region. A height TT1 of the protrusion region PJ1 is a distance from the main surface BE1 to the end surface TE1. A height TT2 of the protrusion region PJ2 is a distance from the main surface BE1 to the end surface TE2. The individual protrusion regions of the processing target layer EL may have different heights. The protrusion region PJ1 has a lower height than the protrusion region PJ2 (a value of the height TT1 of the protrusion region PJ1 is smaller than a value of the height TT2 of the protrusion region PJ2).

The supporting base body BE is made of, by way of example, but not limitation, a material containing Si (silicon). The material of the processing target layer EL may contain, by way of non-limiting example, silicon nitride (e.g., SiN) or the like. In the present exemplary embodiment, the processing target layer EL is made of SiN. However, the exemplary embodiment is not limited thereto, and the processing target layer EL may be made of a material other than the silicon nitride. To be specific, the wafer W may be a substrate product for use in forming, for example, a FinFET (Fin Field Effect Transistor). In this case, the protrusion region PJ1 of the wafer W corresponds to a fin region of the FinFET, and the protrusion region PJ2 of the wafer W corresponds to a gate electrode of the FinFET. The fin region includes a drain electrode and a source electrode, and is extended to intersect the gate electrode. The drain electrode is provided at one end of the fin region, and the source electrode is provided at the other end of the fin region.

End portions (regions including end surfaces such as the end surface TE1, the end surface TE2, and so forth) of the plurality of protrusion regions (the protrusion region PJ1, the protrusion region PJ2, and so forth) may have a shape which is narrowed toward tips thereof (taper shape). In this case, in each of the protrusion regions, a width of the end surface (the end surface TE1, the end surface TE2, or the like) is shorter than a width of a basal end side (a side close to the supporting base body BE). In case that each protrusion region of the processing target layer EL has the shape which is narrowed toward the tip thereof, a width of an opening formed and confined by the end portion of each protrusion region is relatively enlarged, so that formation of a deposit on the end portion of each protrusion region can be suppressed sufficiently.

After the process ST1, a process (first process) of forming a film on each of the end surfaces of the protrusion regions (including the protrusion region PJ1 and the protrusion region PJ2) of the processing target layer EL is performed in the state that the wafer W is placed on the electrostatic chuck ESC, as illustrated in FIG. 2. The corresponding process includes a process ST2 (including the first process and a third process) and a process ST3 (including the first process and a fourth process) shown in FIG. 1, and the corresponding film includes a first film SF1 and a second film SF2 to be described later. As an example, the corresponding film may contain silicon oxide (e.g., a SiO$_2$ film), or may contain another material (e.g., SiN, a metal, or the like) other than the silicon oxide.

Figure 4:
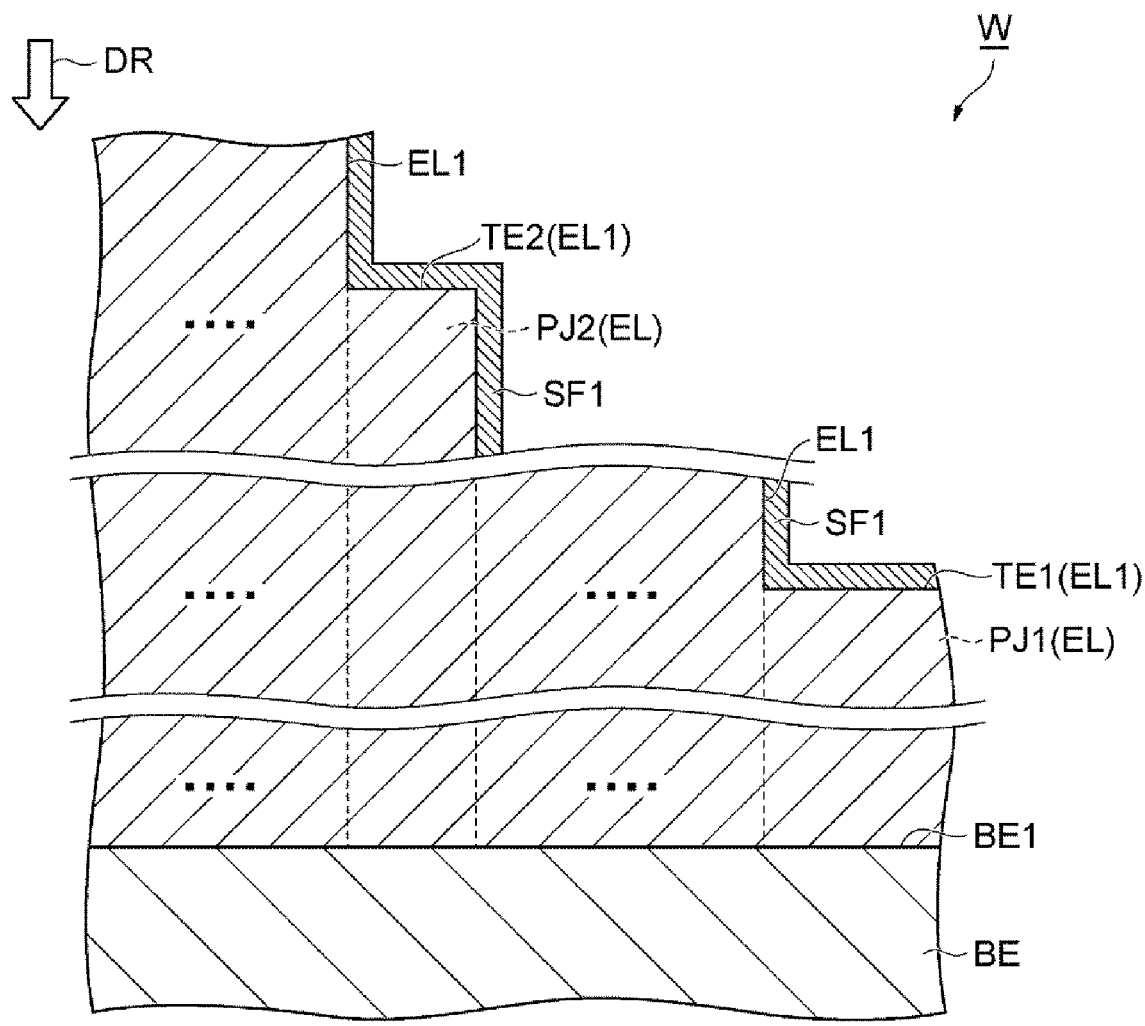
FIG. 4 is a cross sectional view schematically illustrating a state of the major portions of the surface of the wafer while the method shown in FIG. 1 is being performed.
Figure 9:
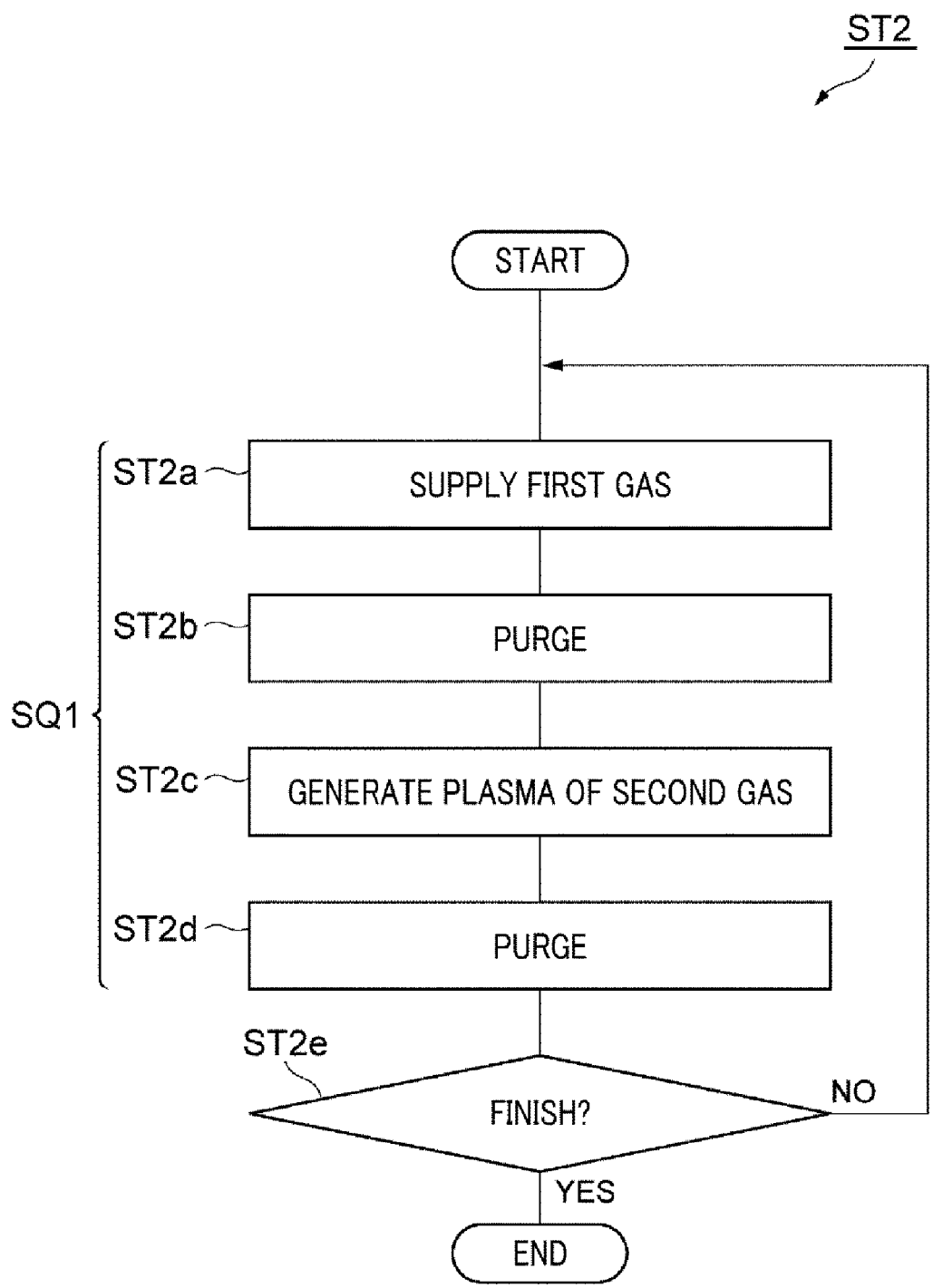
FIG. 9 presents a flowchart for describing a process of a part of the method shown in FIG. 1 in further detail.

In the process ST2 following the process ST1, the first film SF1 is conformally formed on a surface EL1 of the processing target layer EL (particularly, on the end surfaces of the respective protrusion regions of the processing target layer EL) in the state that the wafer W is placed on the electrostatic chuck ESC as depicted in FIG. 2. Details of the process ST2 are shown in FIG. 9. As shown in FIG. 9, the process ST2 includes a process ST2a (fifth process), a process ST2b (sixth process), a process ST2c (seventh process), a process ST2d (eighth process), and a process ST2e. The processes ST2a to ST2d constitute a sequence SQ1 (first sequence). In the process ST2, the sequence SQ1 is performed one or more times. The sequence SQ1 and the process ST2e are processes of conformally forming the first film SF1 on the surface EL1 of the processing target layer EL, as shown in FIG. 4, through the same method as an ALD (Atomic Layer Deposition) method. As a result of performing the series of processes from the sequence SQ1 to the process ST2e, the first film SF1 having a film thickness controlled with high accuracy is conformally formed on the surface of the wafer W (particularly, on the surface EL1 of the processing target layer EL). Hereinafter, as the exemplary embodiment, details of the process ST2 performed when the first film SF1 includes the silicon oxide (e.g., the SiO$_2$ film) will be explained. If, however, the first film SF1 contains a film of another material besides the silicon oxide film containing the silicon oxide, other kinds of gases as well as gas kinds specified below may be used.

Figure 12A:
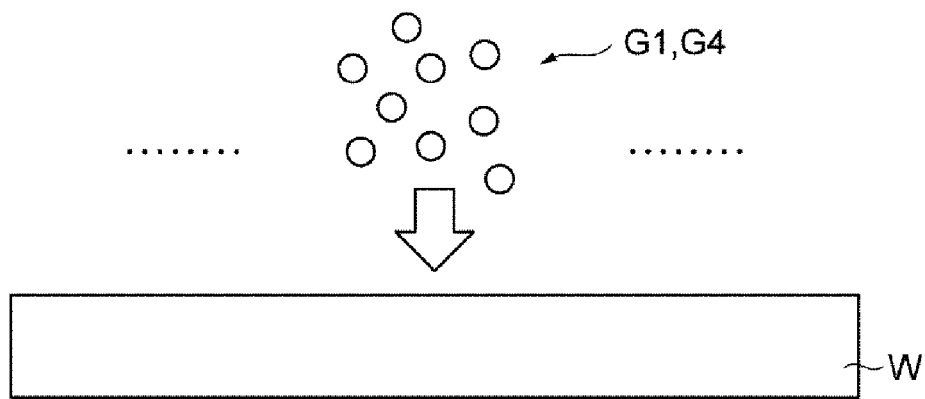
FIG. 12A to FIG. 12C are diagrams schematically illustrating a principle of film formation performed in the method shown in FIG. 1.

In the process ST2a, the first gas G1 is supplied into the processing space S of the processing vessel 12 in which the wafer W is placed. To elaborate, in the process ST2a, the first gas G1 is introduced into the processing space S of the processing vessel 12, as illustrated in FIG. 12A. The first gas G1 includes an organic-containing aminosilane-based gas. The first gas G1 composed of the organic-containing aminosilane-based gas is supplied into the processing space S of the processing vessel 12 from a gas source selected from the plurality of gas sources belonging to the gas source group 40. For example, monoaminosilane (H$_3$—Si—R (R denotes an organic-containing amino group)) may be used as the organic-containing aminosilane-based gas of the first gas G1. In the process ST2a, plasma of the first gas G1 is not generated.

Figure 12B:
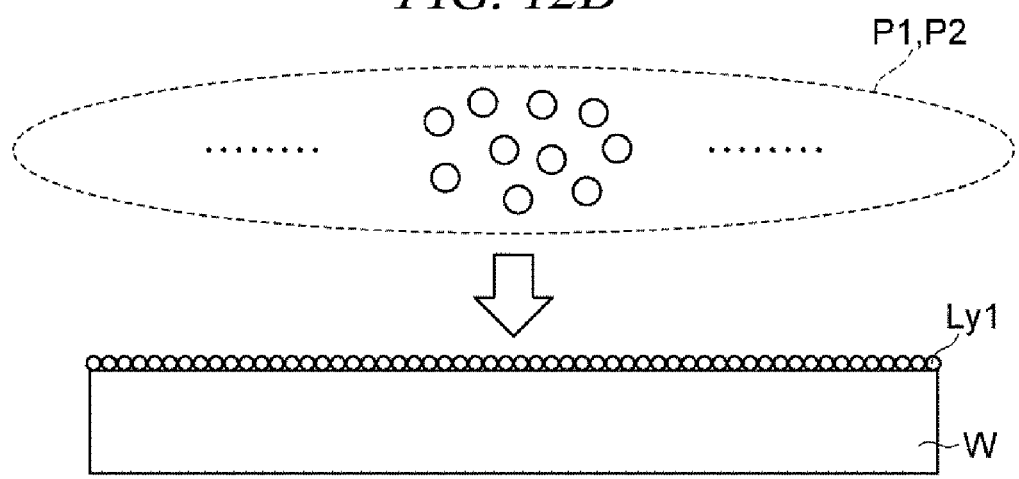

Molecules of the first gas G1 adhere to the surface of the wafer W (including the surface EL1 of the processing target layer EL) as a reaction precursor (layer Ly1), as shown in FIG. 12B. The molecules of the first gas G1 (monoaminosilane) adhere to the surface EL1 of the processing target layer EL by chemical adsorption caused by chemical bond, and no plasma is used. Other than the monoaminosilane, any of various types of gases may be used as long as the gas can be attached to the surface EL1 of the processing target layer EL by the chemical bond and contains silicon. The aminosilane-based gas contained in the first gas G1 may include, besides the monoaminosilane, aminosilane having one to three silicon atoms. Further, the aminosilane-based gas contained in the first gas G1 may include aminosilane having one to three amino groups.

As stated above, since the first gas G1 contains the organic-containing aminosilane-based gas, the reaction precursor of the silicon (layer Ly1) is formed on the surface of the wafer W along an atomic layer of the surface of the wafer W in the process ST2a.

In the process ST2b following the process ST2a, the processing space S of the processing vessel 12 is purged. To elaborate, the first gas G1 supplied in the process ST2a is exhausted. In the process ST2b, an inert gas such as a nitrogen gas or a rare gas (e.g., Ar gas or the like) may be supplied into the processing vessel 12 as a purge gas. That is, the purging of the process ST2b may be implemented by a gas purging of allowing the inert gas to flow in the processing space S of the processing vessel 12 or a purging by vacuum evacuation. In the process ST2b, excess molecules attached on the wafer W can be also removed. Through the above-described processes, the layer Ly1 of the reaction precursor is formed to be a very thin monomolecular layer.

Figure 12C:
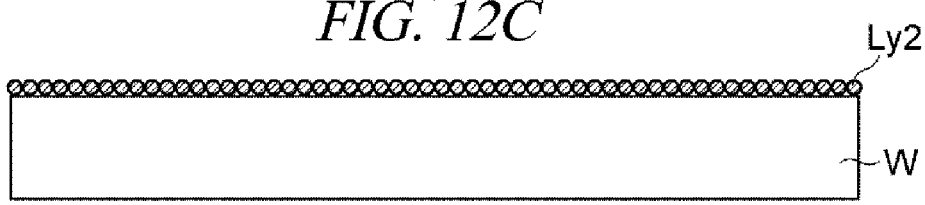

In the process ST2c following the process ST2b, plasma P1 of a second gas is generated in the processing space S of the processing vessel 12, as illustrated in FIG. 12B. The second gas includes a gas containing oxygen atoms. For example, the second gas may contain an oxygen gas. The second gas including the gas containing the oxygen atoms is supplied into the processing space S of the processing vessel 12 from a gas source selected from the plurality of gas sources belonging to the gas source group 40. Then, the high frequency power is supplied from the first high frequency power supply 62. In this case, the bias power may also be applied from the second high frequency power supply 64. Furthermore, it may also be possible to generate the plasma by using only the second high frequency power supply 64 without using the first high frequency power supply 62. By operating the gas exhaust device 50, an internal pressure of the processing space S of the processing vessel 12 is set to a predetermined pressure. As a result, the plasma P1 of the second gas is generated in the processing space S of the processing vessel 12. As depicted in FIG. 12B, if the plasma P1 of the second gas is generated, active species of oxygen, for example, oxygen radials are generated, so that a layer Ly2 of a silicon oxide film (corresponding to the first film SF1) is formed as a monomolecular layer, as shown in FIG. 12C.

As stated above, since the second gas contains the oxygen atoms, in the process ST2c, the corresponding oxygen atoms combine with the reaction precursor (layer Ly1), so that the layer Ly2 of the silicon oxide film can be conformally formed. Thus, the same as in the ALD method, by performing the sequence SQ1 a single time (unit cycle), the layer Ly2 of the silicon oxide film can be conformally formed on the surface of the wafer W.

In the process ST2d following the process ST2c, the processing space S of the processing vessel 12 is purged. To elaborate, the second gas supplied in the process ST2c is exhausted. In the process ST2d, an inert gas such as a nitrogen gas or a rare gas (e.g., Ar gas or the like) may be supplied into the processing vessel 12 as a purge gas. That is, the purging of the process ST2d may be implemented by the gas purging of allowing the inert gas to flow in the processing space S of the processing vessel 12 or the purging by vacuum evacuation.

In the process ST2e following the sequence SQ1, it is determined whether or not to finish the repetition of the sequence SQL To elaborate, in the process ST2e, it is determined whether the repetition number of the sequence SQ1 has reached a preset number. A thickness of the first film SF1 formed on the surface EL1 of the processing target layer EL shown in FIG. 4 relies on the repetition number of the sequence SQL That is, the thickness of the first film SF1 finally formed on the surface EL1 of the processing target layer EL is substantially determined by a product of the repetition number of the sequence SQ1 and a thickness of the silicon oxide film formed by performing the sequence SQ1 a single time (unit cycle). Thus, the repetition number of the sequence SQ1 may be set based on a required thickness of the first film SF1 formed on the surface EL1 of the processing target layer EL. As the sequence SQ1 is carried out repeatedly as stated above, the first film SF1 of the silicon oxide film is conformally formed on the surface EL1 of the processing target layer EL.

If it is determined in the process ST2e that the repetition number of the sequence SQ1 has not reached the preset number (process ST2e: NO), the sequence SQ1 is repeated. If, on the other hand, it is determined in the process ST2e that the repetition number of the sequence SQ1 has reached the preset number (process ST2e: YES), the sequence SQ1 is ended. As a result, as shown in FIG. 4, the first film SF1 of the silicon oxide film is formed on the surface EL1 of the processing target layer EL. That is, as the sequence SQ1 is repeatedly performed the preset number of times, the first film SF1 having the required thickness is conformally formed on the surface EL1 of the processing target layer EL. The thickness of the first film SF1 can be controlled with high accuracy by repeating the sequence SQ1. As described above, in the series of processes of the sequence SQ1 and the process ST2e, the first film SF1 can be conformally formed on the surface EL1 of the processing target layer EL through the same method as the ALD method.

Figure 5:
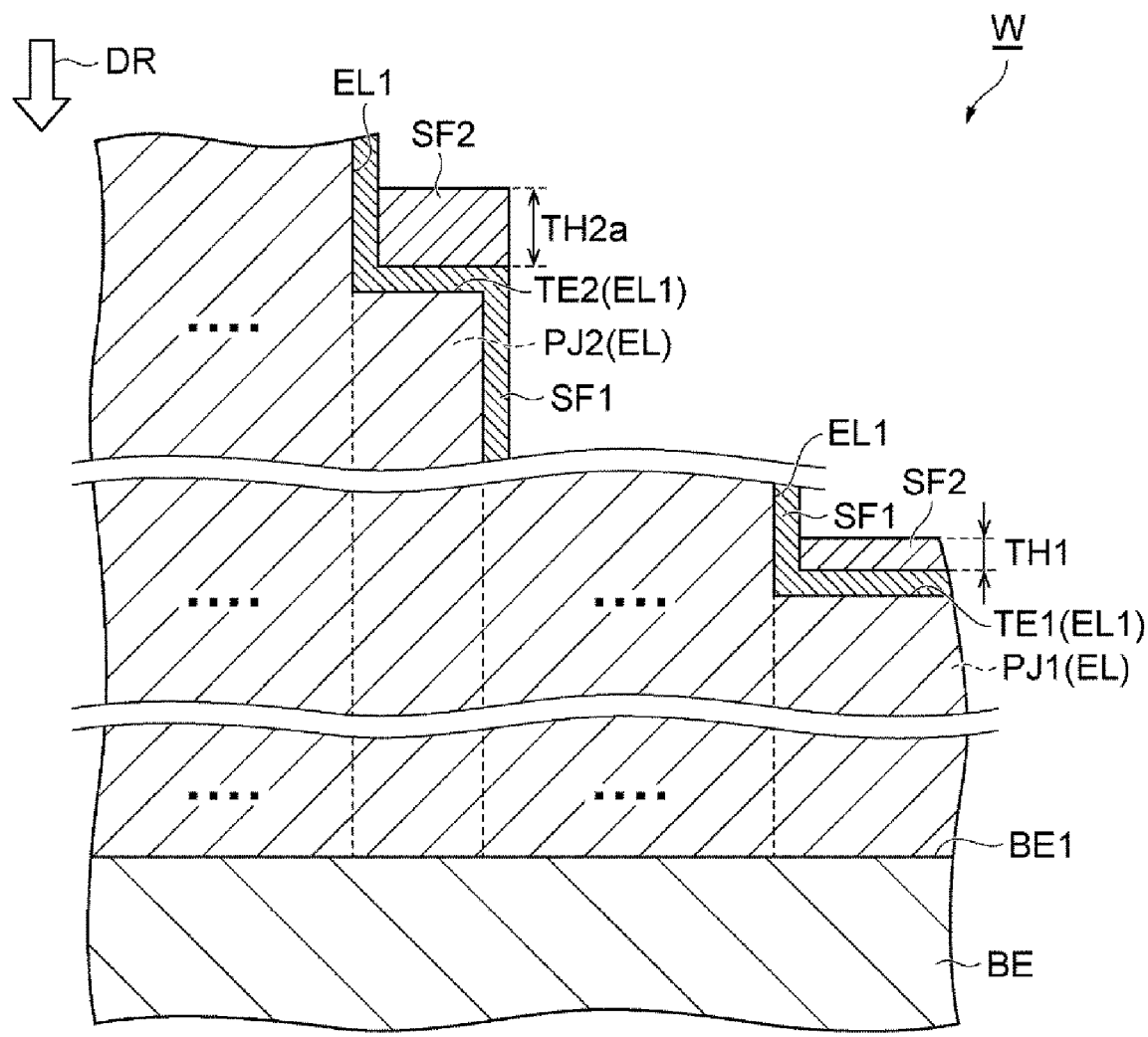
FIG. 5 is a cross sectional view schematically illustrating a state of the major portions of the surface of the wafer while the method shown in FIG. 1 is being performed.

In the process ST3 following the process ST2, a second film SF2 made of the same material as the first film SF1 is formed on the first film SF1 formed in the process ST2 in the state that the wafer W is placed on the electrostatic chuck ESC, as shown in FIG. 2. In the process ST3, the second film SF2 is formed such that a thickness thereof increases as it is distanced farther from the main surface BE1 of the supporting base body BE. To be more specific, through the process ST3, the second film SF2 is formed on the first film SF1, specifically, on the individual end surfaces of the protrusion regions of the processing target layer EL (the end surface TE1 of the protrusion region PJ1, the end surface TE2 of the protrusion region PJ2, etc.), as depicted in FIG. 5. The film formation of the process ST3 is achieved through a process ST31 (fourth process) shown in FIG. 10A or a process ST32 (fourth process) shown in FIG. 10B. The process ST31 shown in FIG. 10A is an example of the process ST3, and the process ST32 shown in FIG. 10B is another example of the process ST3.

The second film SF2 is made of the same material as the first film SF1. As depicted in FIG. 5, a thickness TH1 of a portion of the second film SF2 formed on the end surface TE1 of the protrusion region PJ1 is smaller than a thickness TH2a of a portion of the second film SF2 formed on the end surface TE2 of the protrusion region PJ2. A distance between the end surface TE1 of the protrusion region PJ1 and the main surface BE1 of the supporting base body BE (that is, the height TT1 of the protrusion region PJ1) is shorter than a distance between the end surface TE2 of the protrusion region PJ2 and the main surface BE1 of the supporting base body BE (that is, the height TT2 of the protrusion region PJ2). As stated, in the film formation of the process ST3, the thickness of the film being formed can be controlled depending on the distance from the main surface BE1 of the supporting base body BE (the height of the protrusion region). On the protrusion regions (including the protrusion region PJ1 and the protrusion region PJ2) of the processing target layer EL provided on the main surface BE1 of the supporting base body BE, the higher the height from the main surface BE1 of the supporting base body BE is, the larger the thickness of the second film SF2 formed on the individual end surfaces of the protrusion regions (the end surface TE1 of the protrusion region PJ1, the end surface TE2 of the protrusion region PJ2, etc.) is.

The example case where the film formation of the process ST3 is achieved by the process ST31 shown in FIG. 10A will be explained. Here, as the exemplary embodiment, details of the process ST31 which is performed when the first film SF1 and the second film SF2 contain the silicon oxide (e.g., the $SiO_2$ film) will be described. However, when the first film SF1 and the second film SF2 contain a film of another material besides the silicon oxide film containing the silicon oxide, other kinds of gases as well as gas kinds specified below may also be used. The process ST31 includes a process ST31a and a process ST31b. In the process ST31a, a third gas is supplied into the processing space S of the processing vessel 12 from a gas source selected from the plurality of gas sources belonging to the gas source group 40. The third gas contains silicon atoms and, also, contains chlorine atoms or hydrogen atoms. The third gas contains a $SiCl_4$ gas or a $SiH_4$ gas. By way of non-limiting example, the third gas may be a mixed gas containing the $SiCl_4$ gas, an Ar gas and an oxygen gas. In the third gas, the $SiCl_4$ gas may be replaced with the $SiH_4$ gas. The high frequency power is supplied from the first high frequency power supply 62 and the high frequency bias power is supplied form the second high frequency power supply 64, and the internal pressure of the processing space S of the processing vessel 12 is set to a predetermined pressure by operating the gas exhaust device 50. As a result, plasma of the third gas is generated in the processing space S of the processing vessel 12 in which the wafer W is placed.

Now, another example where the film formation of the process ST3 is implemented by the process ST32 shown in FIG. 10B will be explained. As shown in FIG. 10B, the process ST32 includes a process ST32a (ninth process), a process ST32b (tenth process), a process ST32c (eleventh process), a process ST32d (twelfth process) and a process ST32e. The processes ST32a to ST32d constitute a sequence SQ2 (second sequence). In the process ST32, the sequence SQ2 is performed one or more times. The sequence SQ2 and the process ST32e are processes of forming the second film SF2 on the first film SF1 by a similar method to the process ST2. As the series of processes from the sequence SQ2 to the process ST32e are performed, the second film SF2 made of the same material as the first film SF1 is formed on the first film SF1 (more specifically, on the individual end surfaces of the protrusion regions of the processing target layer EL (the end surface TE1 of the protrusion region PJ1, the end surface TE2 of the protrusion region PJ2, and so forth)). Here, as the exemplary embodiment, details of the process ST32 which is performed when the first film SF1 and the second film SF2 contain the silicon oxide (e.g., the $SiO_2$ film) will be described. However, when the first film SF1 and the second film SF2 contain a film of another material besides the silicon oxide film containing the silicon oxide, other kinds of gases as well as gas kinds specified below may also be used.

In the process ST32a, a fourth gas G4 is supplied into the processing space S of the processing vessel 12. To elaborate, in the process ST32a, the fourth gas G4 is introduced into the processing space S of the processing vessel 12, as illustrated in FIG. 12A. In the process ST32a, the fourth gas G4 is supplied into the processing space S of the processing vessel 12 from a gas source selected from the plurality of gas sources belonging to the gas source group 40. The fourth gas G4 contains silicon atoms and chlorine atoms. The fourth gas G4 may be a mixed gas containing, but not limited to, a $SiCl_4$ gas and an Ar gas. In the process ST32a, plasma of the fourth gas G4 is not generated. Molecules of the fourth gas G4 adhere to the surface of the wafer W (including the surface EL1 of the processing target layer EL) as a reaction precursor (layer Ly1), as shown in FIG. 12B.

In the process ST32b following the process ST32a, the processing space S of the processing vessel 12 is purged. To elaborate, the fourth gas G4 supplied in the process ST32a is exhausted. In the process ST32b, an inert gas such as a nitrogen gas or a rare gas (e.g., Ar gas or the like) may be supplied into the processing vessel 12 as a purge gas. That is, the purging of the process ST32b may be implemented by the gas purging of allowing the inert gas to flow in the processing space S of the processing vessel 12 or the purging by vacuum evacuation. In the process ST32b, excess molecules attached on the wafer W can be also removed.

In the process ST32c following the process ST32b, plasma P2 of a fifth gas is generated in the processing space S of the processing vessel 12, as depicted in FIG. 12B. The fifth gas is supplied into the processing space S of the processing vessel 12 from a gas source selected from the plurality of gas sources belonging to the gas source group 40. The fifth gas contains oxygen atoms. The fifth gas may be a mixed gas containing, by way of example, but not limitation, an oxygen gas and an Ar gas. The high frequency power is supplied from the first high frequency power supply 62. In this case, the bias power from the second high frequency power supply 64 may be applied. Further, it may be also possible to generate the plasma by using only the second high frequency power supply 64 without using the first high frequency power supply 62. The internal pressure of the processing space S of the processing vessel 12 is set to a predetermined pressure by operating the gas exhaust device 50. As a result, the plasma P2 of the fifth gas is generated in the processing space S of the processing vessel 12. If the plasma P2 of the fifth gas is generated as shown in FIG. 12B, active species of oxygen, for example, oxygen radicals are generated, so that a layer Ly2 of the silicon oxide film (corresponding to the second film SF2) is formed, as shown in FIG. 12C. Thus, as in the process ST2, by performing the sequence SQ2 a single time (unit cycle), the layer Ly2 of the silicon oxide film can be formed on the first film SF1.

In the process ST32d following the process ST32c, the processing space S of the processing vessel 12 is purged. To elaborate, the fifth gas supplied in the process ST32c is exhausted. In the process ST32d, an inert gas such as a nitrogen gas or a rare gas (e.g., Ar gas or the like) may be supplied into the processing vessel 12 as a purge gas. That is, the purging of the process ST32d may be implemented by the gas purging of allowing the inert gas to flow in the processing space S of the processing vessel 12 or the purging by vacuum evacuation.

In the process ST32e following the sequence SQ2, it is determined whether or not to finish the repetition of the sequence SQ2. To elaborate, in the process ST32e, it is determined whether the repetition number of the sequence SQ2 has reached a preset number. A thickness of the second film SF2 relies on the repetition number of the sequence SQ2. That is, the thickness of the second film SF2 is determined finally and substantially by a product of the repetition number of the sequence SQ2 and a thickness of the silicon oxide film formed by performing the sequence SQ2 a single time (unit cycle). Thus, the repetition number of the sequence SQ2 may be set based on a required thickness of the second film SF2.

If it is determined in the process ST32e that the repetition number of the sequence SQ2 has not reached the preset number (process ST32e: NO), the sequence SQ2 is repeated. Meanwhile, if it is determined in the process ST32e that the repetition number of the sequence SQ2 has reached the preset number (process ST32e: YES), the sequence SQ2 is ended. Accordingly, as the sequence SQ2 is repeatedly performed the preset number of times, the second film SF2 having the required thickness may be formed on the first film SF1 (particularly, on the individual end surfaces of the protrusion regions of the processing target layer EL (the end surface TE1 of the protrusion region PJ1, the end surface TE2 of the protrusion region PJ2, and so forth) of the first film SF1).

In the process ST4 (second process) following the process ST3, the film (the first film SF1 and the second film SF2), which is formed through the process ST2 and the process ST3, is anisotropically etched in the state that the wafer W is placed on the electrostatic chuck ESC as shown in FIG. 2. As a result, the corresponding film is partially removed (more specifically, portions of the first film SF1 and the second film SF2 formed on one or more end surfaces of the protrusion regions of the processing target layer EL (for example, on the end surface TE1 of the protrusion region PJ1 shown in FIG. 5) are removed). That is, in the process ST4, by anisotropically etching the film (the first film SF1 and the second film SF2) formed through the process ST2 and the process ST3, the one or more end surfaces (for example, the end surface TE1 of the protrusion region PJ1 shown in FIG. 6) are selectively exposed.

Figure 6:
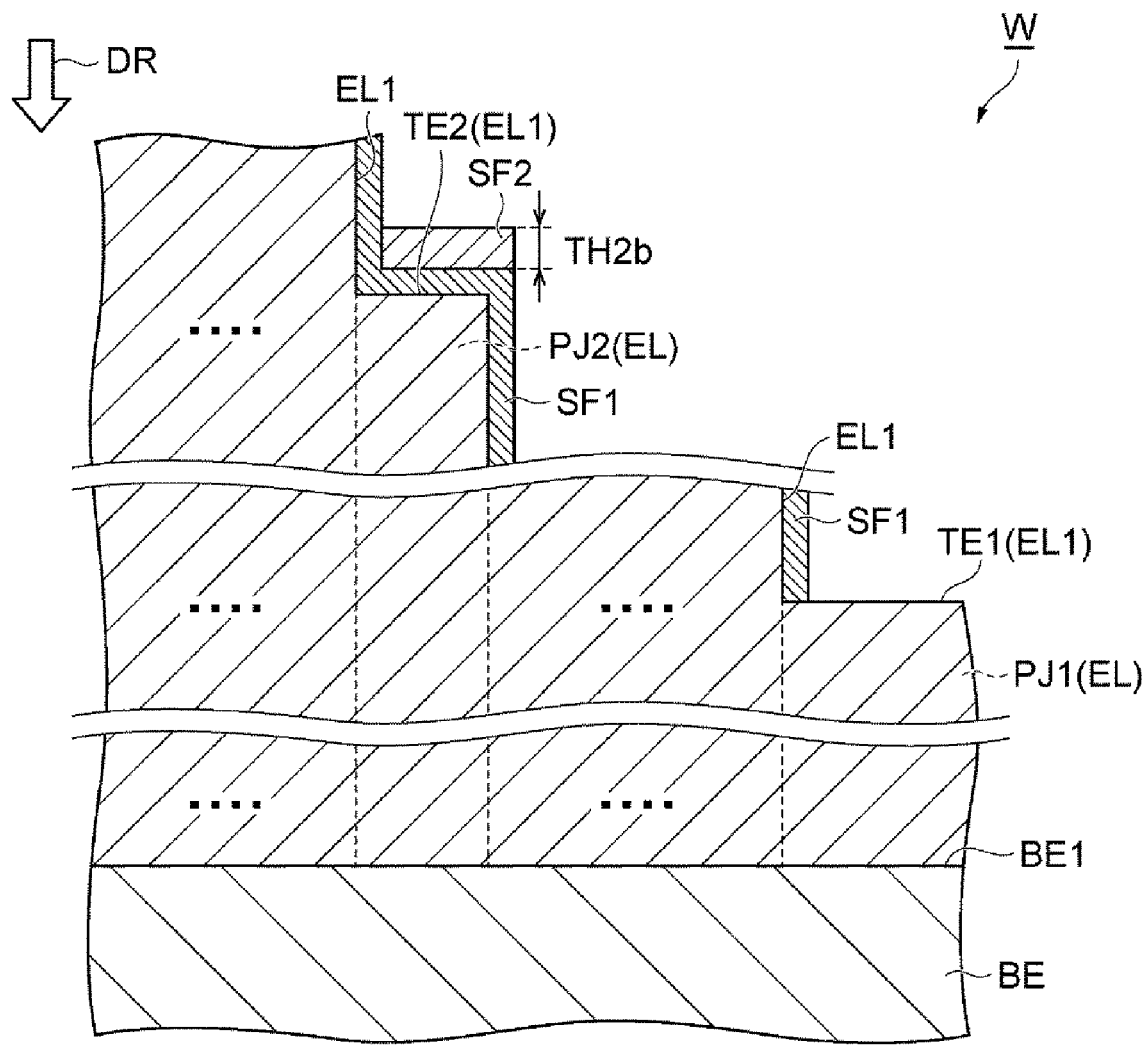
FIG. 6 is a cross sectional view schematically illustrating a state of the major portions of the surface of the wafer while the method shown in FIG. 1 is being performed.

The film formed by the process ST2 and the process ST3 has a larger thickness as the height thereof from the main surface BE1 of the supporting base body BE gets higher. Thus, the lower the height from the main surface BE1 of the supporting base body BE is, the larger the amount of the film removed by the anisotropic etching of the process ST4 may be. Accordingly, in the anisotropic etching of the process ST4, by adjusting processing conditions of the process ST4, it is possible to remove only the film (the first film SF1 and the second film SF2) formed on, among the protrusion regions of the processing target layer EL, the end surface of the protrusion having the lowest height from the main surface BE1 of the supporting base body BE (e.g., the end surface TE1 of the protrusion region PJ1), as illustrated in FIG. 6, for example. Further, in the anisotropic etching of the process ST4, by further adjusting the processing conditions of the process ST4, it is possible to remove only the film (the first film SF1 and the second film SF2) formed, among the protrusion regions of the processing target layer EL, on the respective end surfaces of plural protrusion regions from the (first) protrusion region having the lowest height from the main surface BE1 of the supporting base body BE to the $n^{th}$ protrusion region (n denotes an integer equal to or more than 2, hereinafter) in sequence (e.g., on the respective end surfaces from the end surface TE1 of the protrusion region PJ1 to the end surface TE2 of the protrusion region PJ2). As stated above, through the anisotropic etching of the process ST4, it is possible to selectively remove only the film (the first film SF1 and the second film SF2) formed on the end surface, among the respective end surfaces of the plurality of protrusion regions of the processing target layer EL, of the protrusion region having the lowest height from the main surface BE1 of the supporting base body BE or only the film (the first film SF1 and the second film SF2) formed on the respective end surfaces of the plural protrusion regions from the (first) protrusion region having the lowest height from the main surface BE1 of the supporting base body BE to the $n^{th}$ protrusion region in sequence.

The process ST4 will be elaborated. Hereinafter, as the exemplary embodiment, details of the process ST4 performed in the example case where the first film SF1 and the second film SF2 contain the silicon oxide (e.g., the SiO$_2$ film) will explained. If, however, the first film SF1 and the second film SF2 contain a film of another material other than the silicon oxide film containing the silicon oxide, other kinds of gases as well as gases specified below can be used. A sixth gas is supplied into the processing space S of the processing vessel 12 from a gas source selected from the plurality of gas sources belonging to the gas source group 40. The sixth gas may contain a fluorocarbon-based gas (C$_x$F$_y$, such as CF$_4$, C$_4$F$_8$, or CHF$_3$). The high frequency power is supplied from the first high frequency power supply 62, and the high frequency bias power is supplied from the second high frequency power supply 64. Further, the internal pressure of the processing space S of the processing vessel 12 is set to a predetermined pressure by operating the gas exhaust device 50. As a result, plasma of the sixth gas is generated. Fluorine-containing active species in the generated plasma are attracted in the vertical direction (the surface-perpendicular direction DR) by the high frequency bias power and anisotropically (primarily) etch portions of the film (the first film SF1 and the second film SF2), which is formed through the process ST2 and the process ST3, provided on the respective end surfaces of the protrusion regions of the processing target layer EL. As a result of the anisotropic etching of the process ST4, it is possible to selectively expose, among the protrusion regions of the processing target layer EL, only the end surface of the protrusion region having the lowest height from the main surface BE1 of the supporting base body BE (for example, the end surface TE1 of the protrusion region PJ1 shown in FIG. 6), or only the respective end surfaces of the plural protrusion regions from the (first) protrusion region having the lowest height from the main surface BE1 of the supporting base body BE to the $n^{th}$ protrusion region in sequence (for example, the end surfaces from the end surface TE1 of the protrusion region PJ1 to the end surface TE2 of the protrusion region PJ2). By the etching of the process ST4, the second film SF2 formed on the end surface TE2 of the protrusion region PJ2 becomes to have a thickness TH2$b$, which is obtained after the process ST4 is performed, smaller than the thickness TH2$a$ of the second film SF2, which is obtained before the process ST4 is performed.

Figure 11:
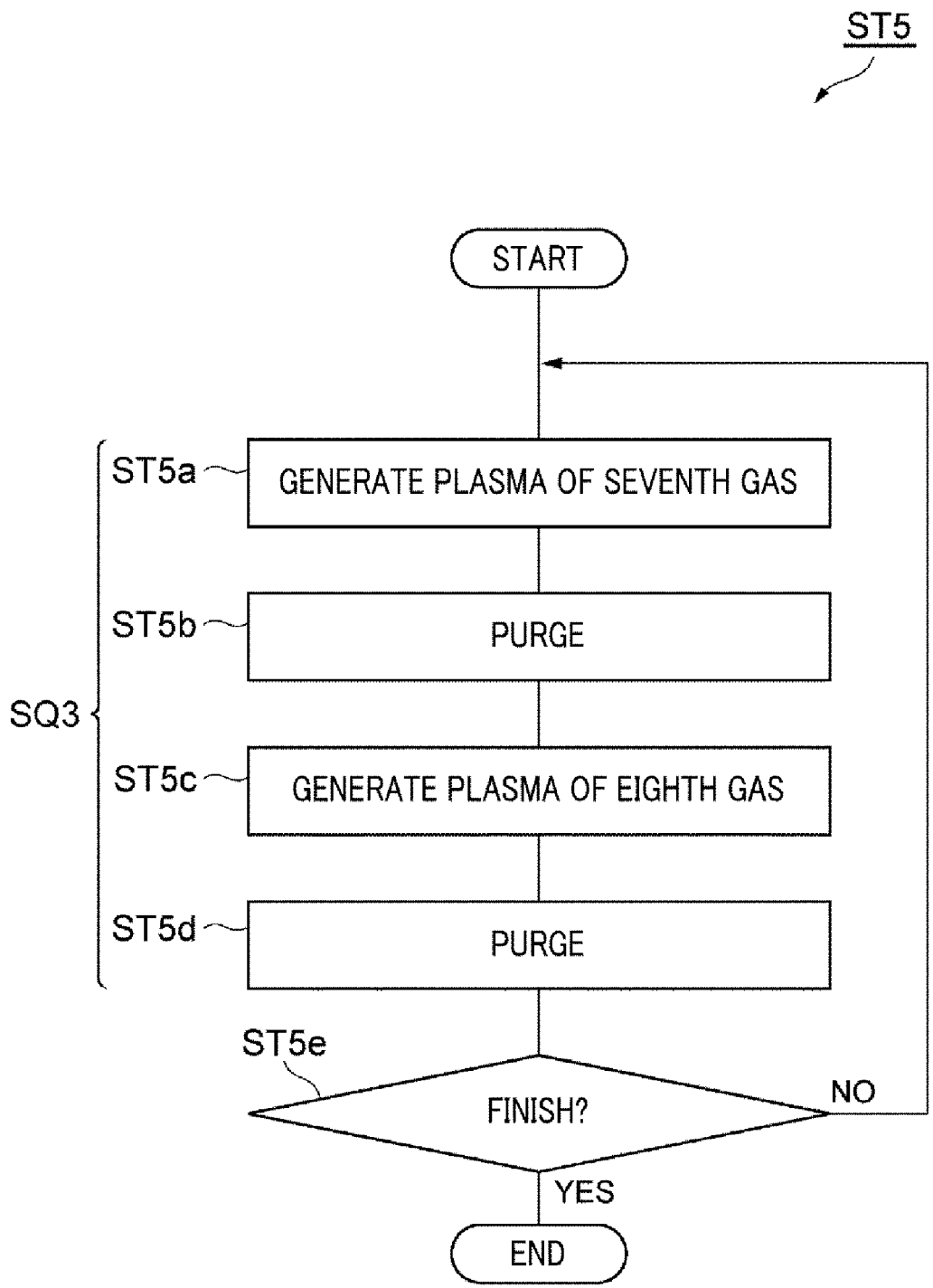
FIG. 11 is a flowchart for describing a process of a part of the method shown in FIG. 1 in further detail.

In the process ST5 (thirteenth process) following the process ST4, the processing target layer EL is anisotropically etched in the state that the wafer W is placed on the electrostatic chuck ESC as shown in FIG. 2. In the process ST5, of the surface EL1 of the processing target layer EL, the end surface selectively exposed by the anisotropic etching of the process ST4 (for example, the end surface TE1 shown in FIG. 6 and will sometimes be referred to as "exposed end surface" in the following) is anisotropically etched atomic layer by atomic layer in the surface-perpendicular direction DR by the same method as the ALE (Atomic Layer Etching) method. Details of the process ST5 is described in FIG. 11. As depicted in FIG. 11, the process ST5 includes a process ST5$a$, a process ST5$b$, a process ST5$c$, a process ST5$d$, and a process ST5$e$. The processes ST5$a$ to ST5$d$ constitute a sequence SQ3. In the process ST5, the sequence SQ3 is performed one (unit cycle) or more times. By repeating the sequence SQ3, the exposed end surface, which is exposed by the process ST4, is removed atomic layer by atomic layer, so that the anisotropic etching is selectively performed on the corresponding exposed end surface. Hereinafter, as the exemplary embodiment, details of the process ST5 which is performed when the first film SF1 and the second film SF2 contain the silicon oxide (e.g., the SiO$_2$ film) will be discussed. However, when the first film SF1 and the second film SF2 contain a film of another material besides the silicon oxide film containing the silicon oxide, other kinds of gases as well as gases specified below may also be used.

In the process ST5$a$, plasma of a seventh gas is generated in the processing space S in which the wafer W is placed, and a mixed layer MX containing ions included in the plasma of the seventh gas is formed on the atomic layer of the exposed end surface of the processing target layer EL. By way of example, in the process ST5$a$, by applying the high frequency bias power from the second high frequency power supply 64 to the plasma of the seventh gas in the surface-perpendicular direction DR, the mixed layer MX containing the ions included in the plasma of the seventh gas can be formed on the atomic layer of the exposed end surface of the processing target layer EL.

In the process ST5$a$, by supplying the seventh gas into the processing space S of the processing vessel 12, the plasma of the seventh gas is generated. The seventh gas contains hydrogen atoms and oxygen atoms and, specifically, may contain a mixed gas of a H$_2$ gas and an O$_2$ gas. To elaborate, the seventh gas is supplied into the processing space S of the processing vessel 12 from a gas source selected from the plurality of gas sources belonging to the gas source group 40. Then, the high frequency power is supplied from the first high frequency power supply 62, and the high frequency bias power is supplied from the second high frequency power supply 64. The internal pressure of the processing space S of the processing vessel 12 is set to a predetermined pressure by operating the gas exhaust device 50. The plasma of the seventh gas is generated in the processing space S of the processing vessel 12. As ions (ions of the hydrogen atoms) included in the plasma of the seventh gas are attracted in the vertical direction (in the surface-perpendicular direction DR) by the high frequency bias power supplied from the second high frequency power supply 64, the ions are brought into contact with the exposed end surface of the processing target layer EL, so that the exposed end surface is anisotropically modified. As stated above, by applying the high frequency bias power to the plasma of the seventh gas from the second high frequency power supply 64, the mixed layer MX containing the ions included in the plasma of the seventh gas is formed on the exposed end surface which is exposed through the process ST4. In the process ST5a, of the surface EL1 of the processing target layer EL (specifically, the respective end surfaces of the protrusion regions of the processing target layer EL), the anisotropically modified portion becomes the mixed layer MX.

Figure 7:
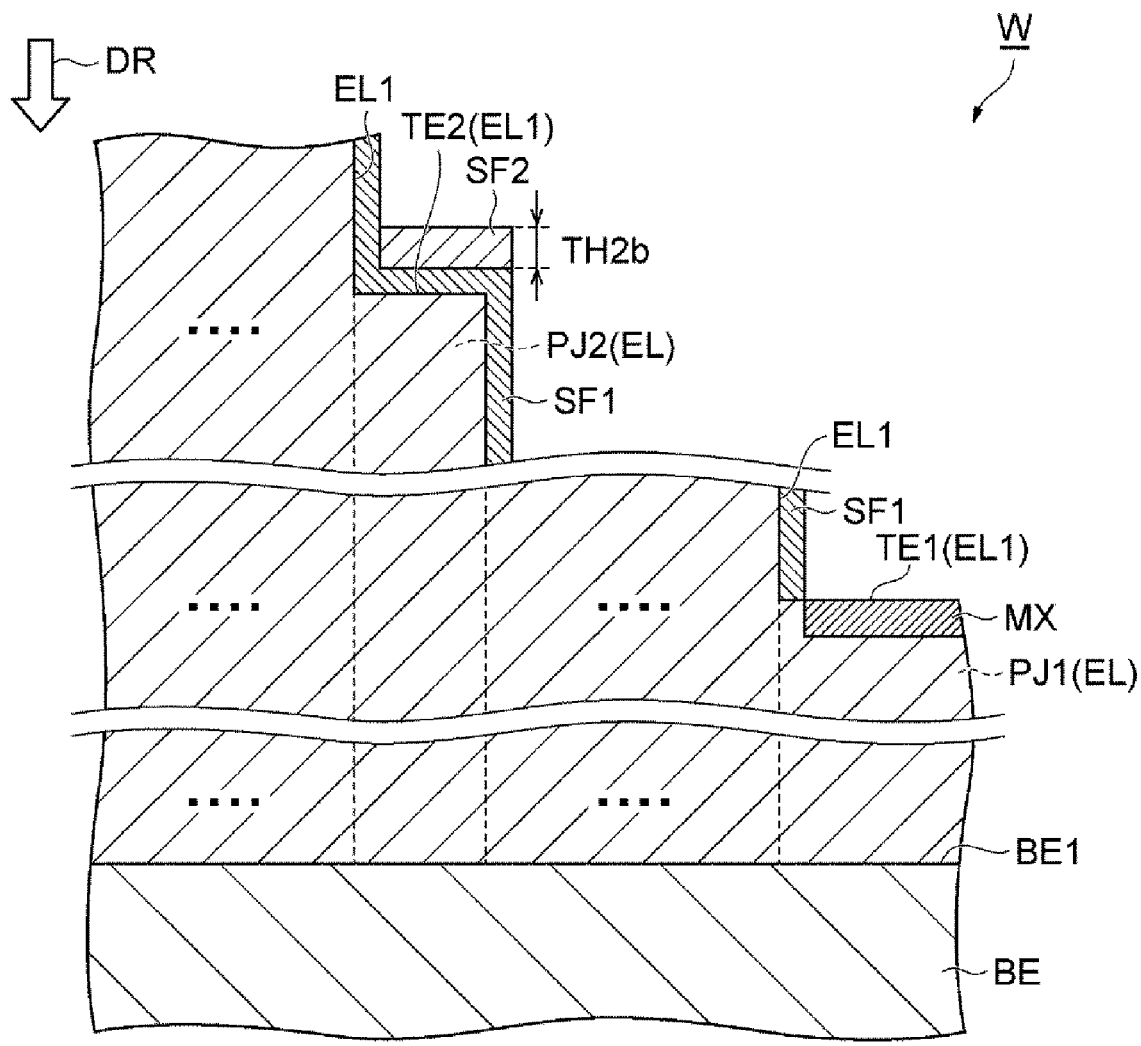
FIG. 7 is a cross sectional view schematically illustrating a state of the major portions of the surface of the wafer while the method shown in FIG. 1 is being performed.
Figure 13C:
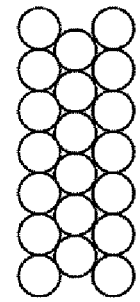
FIG. 13A to FIG. 13C are diagrams schematically illustrating a principle of etching performed in the method shown in FIG. 1.
Figure 13B:
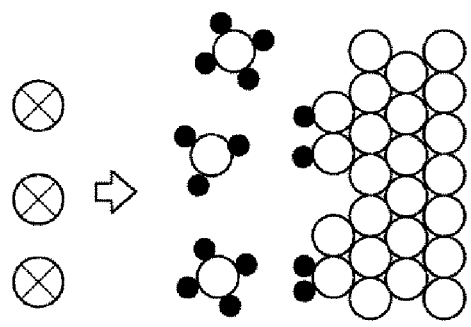
Figure 13A:
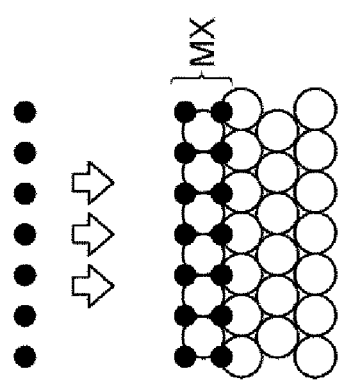

FIG. 13A to FIG. 13C are diagrams illustrating a principle of the etching in the method (sequence SQ3) shown in FIG. 11. In FIG. 13A to FIG. 13C, empty circles (white circles) represent atoms constituting the processing target layer EL (for example, atoms constituting SiN); black-colored circles (black circles) indicate the ions (ions of hydrogen atoms) contained in the plasma of the seventh gas; and encircled 'x' marks indicate radicals included in plasma of an eighth gas to be described later. As depicted in FIG. 13A, through the process ST5a, the ions (black-colored circles (black circles)) of the hydrogen atoms included in the plasma of the seventh gas are anisotropically supplied to the atomic layer of the exposed end surface of the processing target layer EL in the surface-perpendicular direction DR. Accordingly, through the process ST5a, the mixed layer MX containing the atoms constituting the processing target layer EL and the hydrogen atoms of the seventh gas is formed on the atomic layer of the exposed end surface of the processing target layer EL, as shown in FIG. 7.

In the process ST5b following the process ST5a, the processing space S of the processing vessel 12 is purged. To elaborate, the seventh gas supplied in the process ST5a is exhausted. In the process ST5b, an inert gas such as a rare gas (e.g., an Ar gas or the like) may be supplied into the processing vessel 12 as a purge gas. That is, the purging of the process ST5b may be implemented by the gas purging of allowing the inert gas to flow in the processing space S of the processing vessel 12 or the purging by vacuum evacuation.

In the process ST5c following the process ST5b, the plasma of the eighth gas is generated in the processing space S of the processing vessel 12, and the mixed layer MX is removed by radicals included in the plasma (that is, by chemical etching using the corresponding radicals). The plasma of the eighth gas generated in the process ST5c includes the radicals for removing the mixed layer MX. The encircled 'x' marks shown in FIG. 13B indicate the radicals included in the plasma of the eighth gas. The eighth gas contains fluorine atoms. By way of non-limiting example, the eighth gas may include a mixed gas containing a $NF_3$ gas and an $O_2$ gas. Alternatively, the eighth gas may include a mixed gas containing the $NF_3$ gas and a $H_2$ gas. To be more specific, the eighth gas is supplied into the processing space S of the processing vessel 12 from a gas source selected from the plurality of gas sources belonging to the gas source group 40. The high frequency power is supplied from the first high frequency power supply 62, and the high frequency bias power is supplied from the second high frequency power supply 64. By operating the gas exhaust device 50, the internal pressure of the processing space S of the processing vessel 12 is set to a predetermined pressure. As a result, the plasma of the eighth gas is generated in the processing space S of the processing vessel 12. The radicals in the plasma of the eighth gas generated in the process ST5c come into contact with the mixed layer MX. As depicted in FIG. 13B, through the process ST5c, as the radicals of the atoms of the eighth gas are supplied to the mixed layer MX, the mixed layer MX is chemically etched to be removed from the processing target layer EL.

Figure 8:
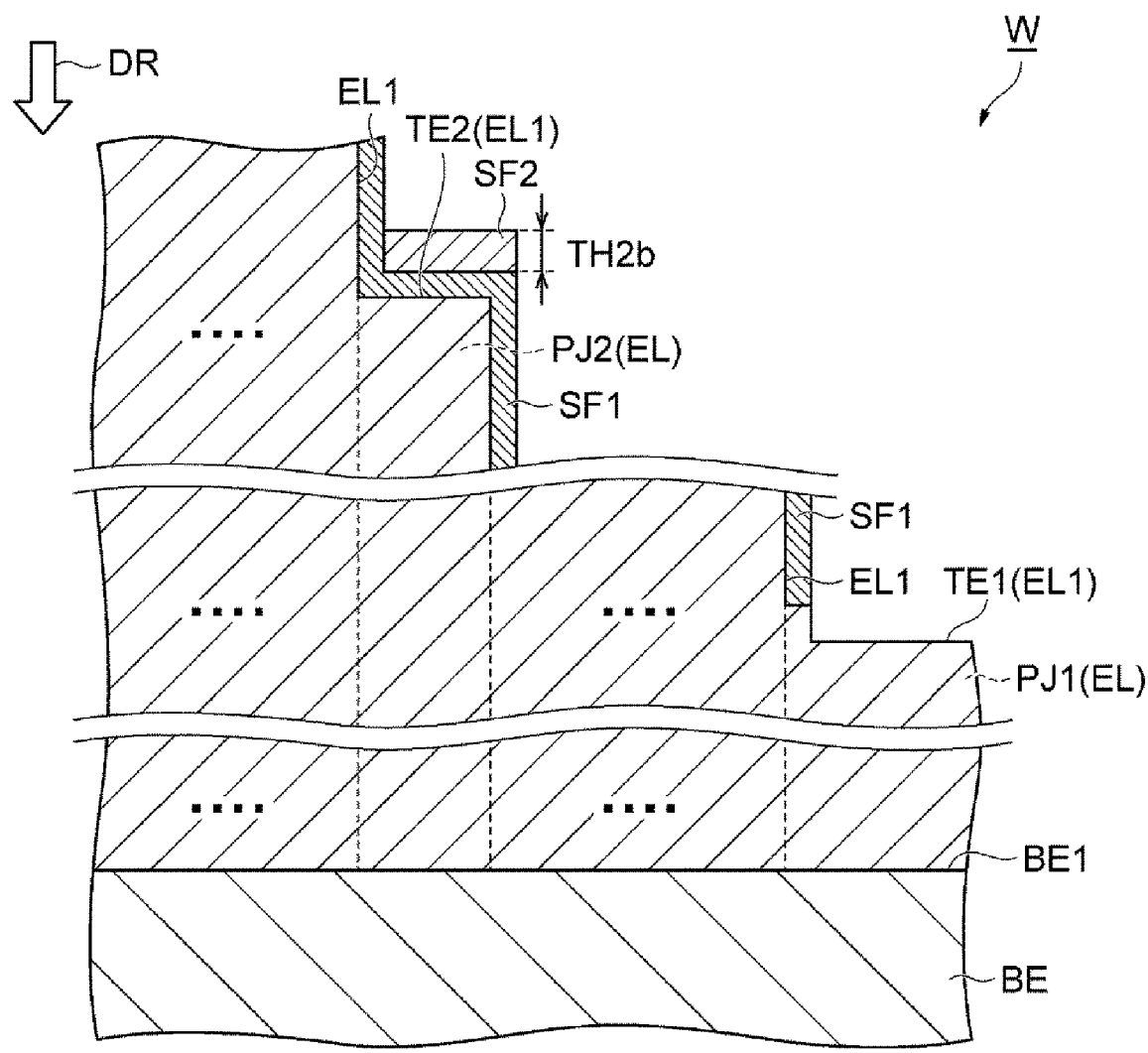
FIG. 8 is a cross sectional view schematically illustrating a state of the major portions of the surface of the wafer after the method shown in FIG. 1 is performed.

As stated above, as shown in FIG. 8 and FIG. 13C, in the process ST5c, the mixed layer MX formed through the process ST5a can be removed from the exposed end surface of the processing target layer EL by the radicals included in the plasma of the eighth gas.

In the process ST5d following the process ST5c, the processing space S of the processing vessel 12 is purged. To elaborate, the eighth gas supplied in the process ST5c is exhausted. In the process ST5d, an inert gas such as a rare gas (e.g., an Ar gas or the like) may be supplied into the processing vessel 12 as a purge gas. That is, the purging of the process ST5d may be implemented by the gas purging of allowing the inert gas to flow in the processing space S of the processing vessel 12 or the purging by vacuum evacuation.

In the process ST5e following the sequence SQ3, it is determined whether or not to finish the repetition of the sequence SQ3. To elaborate, in the process ST5e, it is determined whether the repetition number of the sequence SQ3 has reached a preset number. An etching amount upon the exposed end surface of the processing target layer EL (that is, a depth of a groove formed in the corresponding exposed end surface of the processing target layer EL by the etching) relies on the repetition number of the sequence SQ3. The sequence SQ3 may be repeated such that the exposed end surface of the processing target layer EL is etched until the etching amount upon the exposed end surface of the processing target layer EL reaches a preset value. As the repetition number of the sequence SQ3 is increased, the etching amount upon the exposed end surface of the processing target layer EL is increased (in a substantially linear manner). Thus, the repetition number of the sequence SQ3 may be determined such that a value obtained by a product of a thickness etched by performing the sequence SQ3 a single time (unit cycle) (thickness of the mixed layer MX formed by performing the process ST5a a single time) and the repetition number of the sequence SQ3 reaches a predetermined value.

If it is determined in the process ST5e that the repetition number of the sequence SQ3 has not reached the preset number (process ST5e: NO), the sequence SQ3 is repeated. Meanwhile, if it is determined in the process ST5e that the repetition number of the sequence SQ3 has reached the preset number (process ST5e: YES), the sequence SQ3 is ended.

Through the series of processes from the sequence SQ3 to the process ST5e, the anisotropic etching can be selectively performed only on the exposed end surface of the processing target layer EL, which is exposed in the process ST4, atomic layer by atomic layer with high accuracy through the same method as the ALE method.

In the exemplary embodiment, the etching processing performed after the process ST4 is implemented by the process ST5. However, the exemplary embodiment is not limited thereto, and various other kinds of etching processings may be used. By way of example, an etching processing of performing the same processing sequence as the process ST5 by using a gas different from the gas used in the process ST5, an etching processing using CW (continuous discharge), an etching processing through isotropic etching, or the like may be performed after the process ST4.

In the method MT according to the exemplary embodiment as described above, on the protrusion regions (the protrusion region PJ1, the protrusion region PJ2, and so forth) of the processing target layer EL each having the end surface, the film (the first film SF1 and the second film SF2) is formed on the respective end surfaces (the end surface TE1, the end surface TE2, and so forth) through the process ST2 and the process ST3. Then, only the film on the one or more end surfaces (for example, the end surface TE1 of the protrusion region PJ1) is selectively removed through the process ST4. In particular, the first film SF1 is conformally formed in the process ST2, and the second film SF2 is formed on the first film SF1 in the process ST3 such that the thickness of the second film SF2 is increased as being distanced further from the main surface BE1 of the supporting base body BE. Accordingly, the thickness of the film formed through the process ST2 and the process ST3 is different depending on the distance from the main surface BE1 of the supporting base body BE. Thus, the end surface, on which the film is formed in a relatively thin thickness, is selectively exposed through the process ST4.

Through the process ST2, the first film SF1 having a uniform thickness is conformally formed on the respective end surfaces of the protrusion regions of the processing target layer EL.

Through the process ST2a, the reaction precursor of the silicon can be formed by using the first gas containing the monoaminosilane in the exemplary embodiment.

Through the process ST2a, the aminosilane having the one to three silicon atoms can be used as the aminosilane-based gas included in the first gas in the exemplary embodiment. Further, the aminosilane having the one to three amino groups can be used as the aminosilane-based gas included in the first gas in the exemplary embodiment.

Through the process ST31 (process ST3), with the plasma of the third gas containing the silicon atoms and containing the chlorine atoms or the hydrogen atoms, for example, the third gas containing the $SiCl_4$ gas or the $SiH_4$ gas, the second film SF2 of the silicon oxide film can be additionally formed on the first film SF1 of the silicon oxide film, which is conformally formed in the process ST2 prior to the process ST3, in the exemplary embodiment.

Through the process ST32 (process ST3), the sequence SQ2 including the process ST32a using the fourth gas containing the silicon atoms and the chlorine atoms, for example, the fourth gas containing the mixed gas of the $SiCl_4$ and the Ar gas and including the process ST32c using the plasma of the fifth gas containing the oxygen atoms is repeated. As a result, the second film SF2 of the silicon oxide film can be additionally formed on the first film SF1 of the silicon oxide film, which is conformally formed in the process ST2 prior to the process ST3, in the exemplary embodiment.

Through the process ST4, the end surface, on which the film having the relatively thin thickness is provided, is selectively exposed through the anisotropic etching with the plasma of the fluorocarbon-based gas in the exemplary embodiment.

Through the process ST5, the end surface exposed through the process ST4 is modified atomic layer by atomic layer, so that the mixed layer is formed in the process ST5a. Further, this modified region (corresponding to the mixed layer MX) modified through the process ST5a can be removed in the process ST5c. Thus, as the sequence SQ3 including the process ST5a and the process ST5c is repeated, the end surface exposed through the process ST4 is selectively etched to a required extent. In the process ST5a, by applying the bias power to the seventh gas, the mixed layer MX is selectively formed on the atomic layer of the end surface exposed through the process ST4. Further, through the process ST5c, in the exemplary embodiment, the mixed layer formed through the process ST5a is removed by using the plasma of the eighth gas containing the mixed gas of the $NF_3$ gas and the $O_2$ gas.

From the foregoing, it will be appreciated that the exemplary embodiment of the present disclosure has been described herein for purposes of illustration, and that various modifications may be made without departing from the scope and spirit of the present disclosure. Accordingly, the embodiment disclosed herein is not intended to be limiting. The scope of the inventive concept is defined by the following claims and their equivalents rather than by the detailed description of the exemplary embodiment. It shall be understood that all modifications and embodiments conceived from the meaning and scope of the claims and their equivalents are included in the scope of the inventive concept.

By way of example, the kinds of the first to eighth gases may not be limited to those specified in the above-described exemplary embodiment, and various other kinds of gases capable of achieving the same effects as those of the above-described exemplary embodiment can be used instead. Furthermore, the material of the processing target layer EL is not limited to the one specified in the exemplary embodiment, and various other kinds of materials having the same effects as those of the exemplary embodiment can be used instead.

We claim:

1. A film forming method for a processing target object, the processing target object having a supporting base body and a processing target layer, the processing target layer being provided on a main surface of the supporting base body and including protrusion regions, each of the protrusion regions being extended upwards from the main surface, and an end surface of each of the protrusion regions being exposed when viewed from above the main surface, the film forming method comprising:
   a first process of forming a film, including a first film and a second film, on the end surface of each of the protrusion regions, the first process comprising:
      forming the first film conformally; and
      forming the second film on the first film such that a thickness of the second film is increased as being distanced farther from the main surface; and
   a second process of selectively exposing one or more of the end surfaces by anisotropically etching the film formed through the first process.

2. The film forming method of claim 1,
   wherein the first film is conformally formed by repeating a first sequence comprising:
   a third process of supplying a first gas into a space in which the processing target object is placed;
   a fourth process of purging, after the third process, the space in which the processing target object is placed;
   a fifth process of generating, after the fourth process, plasma of a second gas in the space in which the processing target object is placed; and
   an sixth process of purging, after the fifth process, the space in which the processing target object is placed,
   wherein plasma of the first gas is not generated in the third process.

3. The film forming method of claim 2,
wherein the first gas contains an organic-containing aminosilane-based gas, and
the second gas contains oxygen atoms.

4. The film forming method of claim 3,
wherein the first gas contains monoaminosilane.

5. The film forming method of claim 3,
wherein the aminosilane-based gas contained in the first gas includes aminosilane having one to three silicon atoms.

6. The film forming method of claim 3,
wherein the aminosilane-based gas contained in the first gas includes aminosilane having one to three amino groups.

7. The film forming method of claim 1,
wherein, in the forming the second film on the first film, plasma of a third gas is generated in a space in which the processing target object is placed.

8. The film forming method of claim 7,
wherein the third gas contains silicon atoms and contains chlorine atoms or hydrogen atoms.

9. The film forming method of claim 8,
wherein the third gas includes a $SiCl_4$ gas or a $SiH_4$ gas.

10. The film forming method of claim 1,
wherein the second film is formed by repeating a second sequence comprising:
a seventh process of supplying a fourth gas into a space in which the processing target object is placed;
a eighth process of purging, after the seventh process, the space in which the processing target object is placed;
an ninth process of generating, after the eighth process, plasma of a fifth gas in the space in which the processing target object is placed; and
a tenth process of purging, after the ninth process, the space in which the processing target object is placed,
wherein plasma of the fourth gas is not generated in the seventh process.

11. The film forming method of claim 10,
wherein the fourth gas contains silicon atoms and chlorine atoms, and
the fifth gas contains oxygen atoms.

12. The film forming method of claim 11,
wherein the fourth gas includes a mixed gas containing a $SiCl_4$ gas and an Ar gas.

13. The film forming method of claim 1,
wherein, in the second process, plasma of a sixth gas is generated in a space in which the processing target object is placed and a bias power is applied to the plasma of the sixth gas.

14. The film forming method of claim 13,
wherein the sixth gas contains a fluorocarbon-based gas.

15. The film forming method of claim 1, further comprising:
a eleventh process of etching the processing target layer after the second process is performed.

16. The film forming method of claim 1,
wherein the processing target layer includes silicon nitride, and
the film contains silicon oxide.

17. A film forming method for a target object, the film forming method comprising:
providing the target object having a supporting base and a target layer, the target layer being provided on a main surface of the supporting base and including protruding regions, each of the protruding regions being extended upwards from the main surface, and an end surface of each of the protruding regions being exposed;
forming a first film conformally on the end surface of each of the protruding regions by atomic layer deposition;
forming a second film on the first film by a plasma such that a thickness of the second film is increased as being distanced farther from the main surface; and
anisotropically etching the first film and the second film to selectively expose one or more of the end surfaces.

18. The film forming method of claim 17,
wherein the anisotropically etching is atomic layer etching.

19. A film forming method for a processing target object, the method comprising:
providing the processing target object having a supporting base body and a processing target layer provided on a main surface of the supporting base body and including protrusion regions, each of the protrusion regions being extended upwards from the main surface, and an end surface of each of the protrusion regions being exposed when viewed from above the main surface,
(a) forming a film on the end surface of each of the protrusion regions such that a thickness of the film is increased as being distanced farther from the main surface; and
(b) selectively exposing one or more of the end surfaces by anisotropically etching the film formed through (a),
wherein (a) comprises forming a first film conformally and forming a second film such that a thickness of the second film is increased as being distanced farther from the main surface.

* * * * *